United States Patent
Nakayama

(10) Patent No.: US 12,507,373 B2
(45) Date of Patent: Dec. 23, 2025

(54) POWER CONVERSION DEVICE

(71) Applicant: Mitsubishi Electric Corporation, Tokyo (JP)

(72) Inventor: Tomoyuki Nakayama, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 189 days.

(21) Appl. No.: 18/557,091

(22) PCT Filed: Jul. 5, 2021

(86) PCT No.: PCT/JP2021/025254
§ 371 (c)(1),
(2) Date: Oct. 25, 2023

(87) PCT Pub. No.: WO2023/281557
PCT Pub. Date: Jan. 12, 2023

(65) Prior Publication Data
US 2024/0224462 A1  Jul. 4, 2024

(51) Int. Cl.
H05K 7/20 (2006.01)
H02M 1/32 (2007.01)
(Continued)

(52) U.S. Cl.
CPC ........ H05K 7/20154 (2013.01); H02M 1/327 (2021.05); H02M 7/003 (2013.01); H02M 7/53871 (2013.01); H05K 7/14322 (2022.08)

(58) Field of Classification Search
CPC .......... H05K 7/14322; H05K 7/20154; H02M 1/327; H02M 7/003; H02M 7/53871
(Continued)

(56) References Cited

U.S. PATENT DOCUMENTS

2003/0133259 A1* 7/2003 Meyer ..................... H02M 1/44
361/677
2009/0065182 A1* 3/2009 Takahashi .......... H05K 7/20936
165/104.33
(Continued)

FOREIGN PATENT DOCUMENTS

JP 2002262582 A 9/2002
JP 2014055702 A 3/2014

OTHER PUBLICATIONS

International Search Report (PCT/ISA/210) with English translation and Written Opinion (PCT/ISA/237) mailed on Sep. 21, 2021, by the Japanese Patent Office as the International Searching Authority for International Application No. PCT/JP2021/025254.

Primary Examiner — Zhengfu J Feng
(74) Attorney, Agent, or Firm — BUCHANAN, INGERSOLL & ROONEY PC

(57) ABSTRACT

A power conversion device includes a power conversion circuit, a housing, at least one heat pipe and a controller. The power conversion circuit includes switching elements, converts electric power inputted thereto into electric power to be supplied to load equipment and supplies to the load equipment the electric power resulting from the conversion. The at least one heat pipe is exposed to air outside of the housing and releases, to the air, heat transferred from the switching elements. The controller controls switching operations of the plurality of switching elements such that a target voltage is outputted from the power conversion circuit and an amount of heat generation of the plurality of switching elements is obtained that is based on an operational status of the load equipment and a temperature of the air.

20 Claims, 24 Drawing Sheets

(51) Int. Cl.
*H02M 7/00* (2006.01)
*H02M 7/5387* (2007.01)
*H05K 7/14* (2006.01)

(58) Field of Classification Search
USPC .......................................................... 361/695
See application file for complete search history.

(56) References Cited

U.S. PATENT DOCUMENTS

| | | | | |
|---|---|---|---|---|
| 2013/0135811 | A1* | 5/2013 | Dunwoody | F28F 9/00 |
| | | | | 361/679.31 |
| 2014/0374081 | A1* | 12/2014 | Kakehashi | B60H 1/00278 |
| | | | | 429/120 |
| 2016/0093788 | A1* | 3/2016 | Matsumoto | H05K 7/20336 |
| | | | | 136/212 |
| 2018/0064001 | A1* | 3/2018 | Ledezma | H05K 7/20936 |
| 2019/0281725 | A1* | 9/2019 | Byers | H04Q 1/02 |

* cited by examiner

POWER CONVERSION DEVICE

TECHNICAL FIELD

The present disclosure relates to a power conversion device.

BACKGROUND ART

Some types of power conversion device include, in order to prevent damage to an electronic component such as a switching element due to heat generated by energization, a cooling device thermally connected to the electronic component that is an exothermic element. The cooling device releases, to surrounding air, heat transferred from the electronic component, resulting in cooling of the electronic component. Patent Literature 1 discloses an example of such type of power conversion device. The power conversion device disclosed in Patent Literature 1 includes, as the cooling device, a heat pipe that is cooled by air blown by an air blower. To suppress occurrence of freezing of a refrigerant sealed in the heat pipe, the air blower operates when a temperature detected by a temperature detector is higher than or equal to a threshold, and stops operating when the temperature detected by the temperature detector is lower than the threshold.

CITATION LIST

Patent Literature

Patent Literature 1: Unexamined Japanese Patent Application Publication No. 2002-262582

SUMMARY OF INVENTION

Technical Problem

Switching between operation and stoppage of the air blower disclosed in Patent Literature 1 is performed depending only on a magnitude relationship between the temperature detected by the temperature sensor and a threshold temperature. Due to this, regardless of a state of travel of a vehicle in which the power conversion device is installed, the air blower stops operating in response to the temperature detected by the temperature detector being lower than the threshold temperature and operates in response to the temperature detected by the temperature detector being higher than or equal to the threshold temperature.

The air blower continues to operate in any case in which the temperature detected by the temperature detector is higher than or equal to the threshold, for example, even in a case in which, just before stoppage of the vehicle, an amount of heat generated by the electronic component is low. This configuration may possibly cause excessive cooling of the heat pipe and freeze the refrigerant. The frozen refrigerant is unable to circulate in the heat pipe and therefore is unable to cool the electronic component.

Similarly, a naturally-cooled type power conversion device that does not include an air blower is unable to sufficiently cool the electronic component in a case in which a refrigerant freezes in response to a surrounding temperature being equal to or lower than a temperature at which the refrigerant is freezable.

The present disclosure is made in view of the aforementioned circumstances, and an objective of the present disclosure is to provide a power conversion device having high cooling performance.

Solution to Problem

To achieve the aforementioned objective, a power conversion device according to the present disclosure includes a power conversion circuit, a housing, at least one heat pipe and a controller. The power conversion circuit includes a plurality of switching elements, converts electric power inputted thereto into electric power to be supplied to load equipment and supplies to the load equipment the electric power resulting from the conversion. The housing houses the power conversion circuit. The at least one heat pipe is, with a refrigerant sealed therein, thermally connected to the plurality of switching elements included in the power conversion circuit. The at least one heat pipe is exposed to air outside of the housing and releases, to the air, heat transferred from the plurality of switching elements. The controller controls switching operations of the plurality of switching elements such that (i) a target voltage as a target value of an output voltage is outputted from the power conversion circuit and (ii) an amount of heat generation of the plurality of switching elements is obtained that is based on an operational status of the load equipment and a temperature of the air.

Advantageous Effects of Invention

The controller included in the power conversion device according to the present disclosure controls the switching operations of the plurality of switching elements such that the target voltage is outputted and the amount of the heat generation is obtained that is based on the operational status of the load equipment and the temperature of the air. This configuration enables cooling of the electronic component even in a low-temperature environment in which the refrigerant is freezable, and thus a power conversion device having high cooling performance can be obtained.

DESCRIPTION OF EMBODIMENTS

Figure 1:
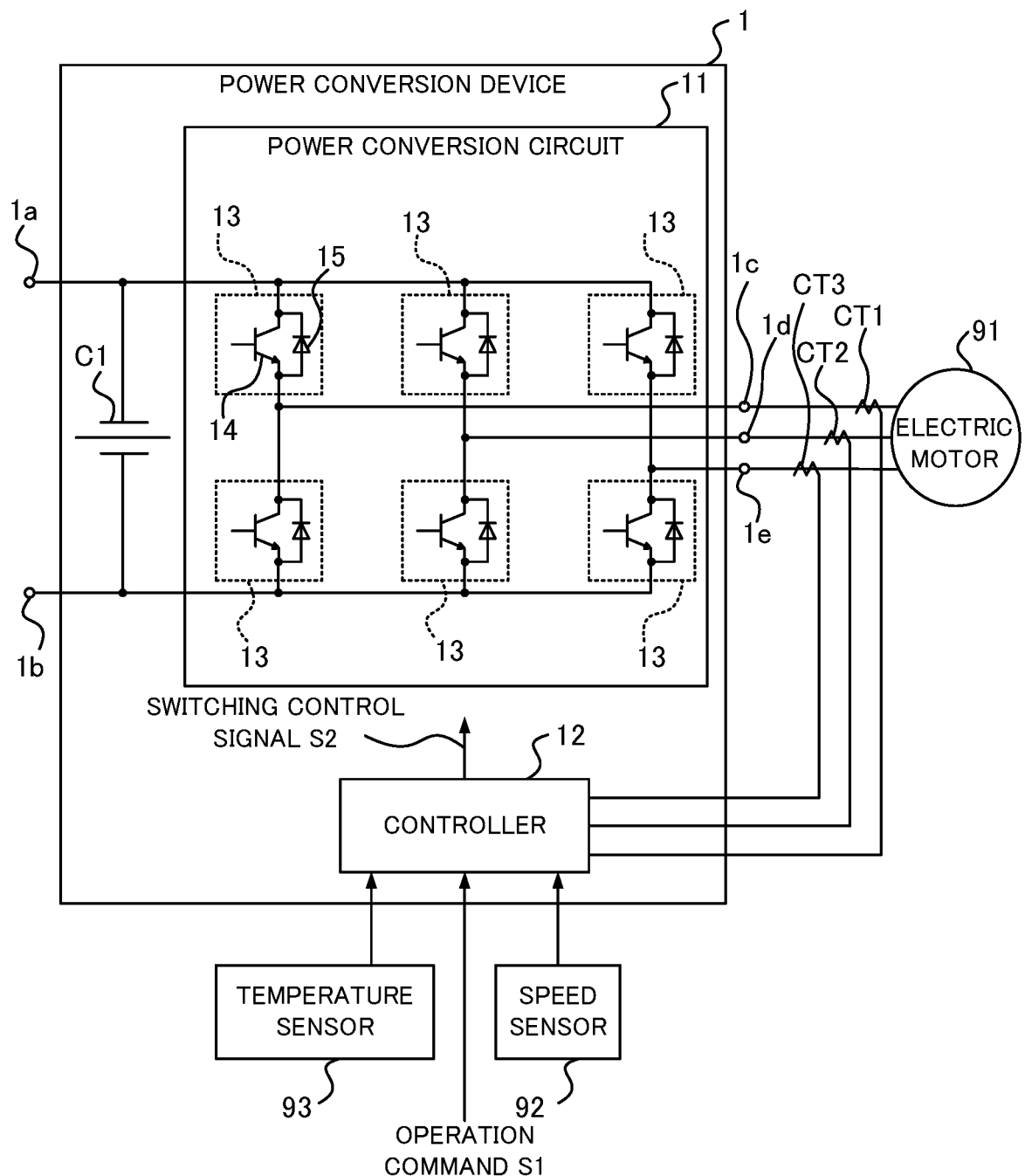
FIG. 1 is a circuit diagram of a power conversion device according to Embodiment 1.

Hereinafter, power conversion devices according to embodiments of the present disclosure are described in detail with reference to the drawings. In the drawings, the same reference sign is assigned to the same or equivalent parts.

Embodiment 1

As an example of a power conversion device, a direct-current to three-phase alternating-current conversion device exists that is installed in a railway vehicle, converts direct-current power supplied from a direct-current power source into three-phase alternating-current power and supplies such three-phase alternating-current power to load equipment. A power conversion device 1 according to Embodiment 1 is described using, as an example, a direct-current to three-phase alternating-current conversion device installed in a railway vehicle. In Embodiment 1, the power conversion device 1 as illustrated in FIG. 1 is installed in a railway vehicle that employs the direct-current mode, and an electric motor 91, that is load equipment that receives supply of three-phase alternating-current power from the power conversion device 1, is a three-phase induction motor that is driven by supply of three-phase alternating-current power to produce a force for driving the railway vehicle.

The power conversion device 1 includes an input terminal 1a to be connected to a power source, an input terminal 1b to be grounded, and output terminals 1c, 1d and 1e connected to the electric motor 91. The power conversion device 1 further includes a power conversion circuit 11 that converts direct-current power supplied from the power source into three-phase alternating-current power supplied to the electric motor 91 and supplies the three-phase alternating-current power to the electric motor 91. The power conversion device 1 further includes a capacitor C1 connected between a pair of primary terminals that is connected to the input terminals 1a and 1b, and a controller 12 that controls the power conversion circuit 11.

The input terminal 1a is preferably electrically connected, via a non-illustrated contactor, a non-illustrated reactor, or the like, to the power source, more specifically, to a power collector that acquires electric power supplied from a power substation via a power supply line. The power collector is, for example, a pantograph that acquires electric power via an overhead wire that is an example of the power supply line, or a contact shoe that acquires electric power via a third rail that is an example of the power supply line. The input terminal 1b is grounded via anon-illustrated ground ring, anon-illustrated ground brush, anon-illustrated wheel, or the like. The output terminals 1c, 1d and 1e are terminals that correspond respectively to a U-phase, a V-phase and a W-phase of the three-phase alternating-current power.

The power conversion circuit 11 includes three series-connected pairs of two switching elements 13. The three pairs of the switching elements 13 correspond respectively to the U-phase, the V-phase and the W-phase of the three-phase alternating-current power. The two switching elements 13 corresponding to the U-phase, the two switching elements 13 corresponding to the V-phase and the two switching elements 13 corresponding to the W-phase are connected between the input terminals 1a and 1b so as to be parallel to one another.

A connection point of the two switching elements 13 corresponding to the U-phase is electrically connected to the output terminal 1c. A connection point of the two switching elements 13 corresponding to the V-phase is electrically connected to the output terminal 1d. A connection point of the two switching elements 13 corresponding to the W-phase is electrically connected to the output terminal 1e.

In Embodiment 1, each of the switching elements 13 includes an insulated gate bipolar transistor (IGBT) 14 and a freewheeling diode 15 having an anode connected to an emitter terminal of the IGBT 14 and a cathode connected to a collector terminal of the IGBT 14. A switching control signal S2 from the controller 12 is supplied to a gate terminal of the IGBT 14 included in each of the switching elements 13. The switching control signal S2 causes on/off switching of each of the switching elements 13. By performance of a switching operation by each of the switching elements 13 for switching between on-state and off-state, the power conversion circuit 11 converts the direct-current power into the three-phase alternating-current power. Each of the switching elements 13 is preferably formed of a wide bandgap semiconductor that includes silicon carbide, gallium nitride-based material, or diamond.

The capacitor C1 is connected between the pair of the primary terminals of the power conversion circuit 11 and is charged with the direct-current power supplied from the power source. The capacitor C1 reduces a harmonic component included in the direct-current power supplied from the power source.

The controller 12 acquires, from a speed sensor 92 that detects a rotation speed of the electric motor 91, a measurement value of the rotation speed of the electric motor 91 per unit time. The speed sensor 92 includes, for example, a pulse generator (PG) that is coupled to an axle of the railway vehicle and that outputs s sensor signal of a value that changes depending on a rotation of the axle. From the sensor signal outputted by the PG, the speed sensor 92 determines and outputs the rotation speed of the electric motor 91 per unit time.

The controller 12 acquires, from current sensors CT1, CT2 and CT3 that each measure a corresponding one of U-phase current, V-phase current and W-phase current that are outputted by the power conversion circuit 11, measurement values of the U-phase current, the V-phase current and the W-phase current. The controller 12 acquires, from a temperature sensor 93 that detects a temperature of air outside of the power conversion device 1, a measurement value of the temperature. The controller 12 acquires an operation command S1 from anon-illustrated driver cab. The operation command S1 indicates a command associated with an operation, by an operator, of a master controller installed in the driver cab. Specifically, the operation command S1 indicates any one of a power running command, a brake command or a coasting command.

Based on the measurement value of the rotation speed of the electric motor 91, the measurement values of the U-phase current, the V-phase current and the W-phase current, and the operation command S1 that are acquired as above, the controller 12 determines a target voltage of the power conversion circuit 11. Further, the controller 12 controls the multiple switching elements 13 such that (i) a target voltage as a target value of an output voltage is outputted from the power conversion circuit 11 and (ii) an amount of heat generation of the multiple switching elements 13 is obtained that is based on the measurement value of the rotation speed of the electric motor 91 that is an indicator of an operational status of the load equipment and the temperature of the air outside of the power conversion device 1.

Specifically, the controller 12 adjusts a parameter of the switching operations that contributes to increase and decrease in the amount of the heat generation of the multiple switching elements 13 such that an amount of the heat generation of the multiple switching elements 13 is obtained that is based on the measurement value of the rotation speed of the electric motor 91 and the temperature of the air outside of the power conversion device 1. In Embodiment 1, the parameter includes a switching frequency. The controller 12 generates, for each of the switching elements 13, using an adjusted switching frequency, a switching control signal S2 for controlling the switching element 13 such that the output voltage of the power conversion circuit 11 approaches the target voltage, and supplies the switching control signal S2 to the switching element 13.

In order to prevent occurrence of malfunction of electronic components, more specifically, malfunction of the switching elements 13, due to heat generated by energization of the power conversion circuit 11, the power conversion device 1 includes a cooling mechanism. Structure of the power conversion device 1 that includes the cooling mechanism is described below with reference to FIG. 2 and FIG. 3, and with reference to FIG. 4 that is a cross-sectional view taken along the line IV-IV of FIG. 2.

Figure 2:
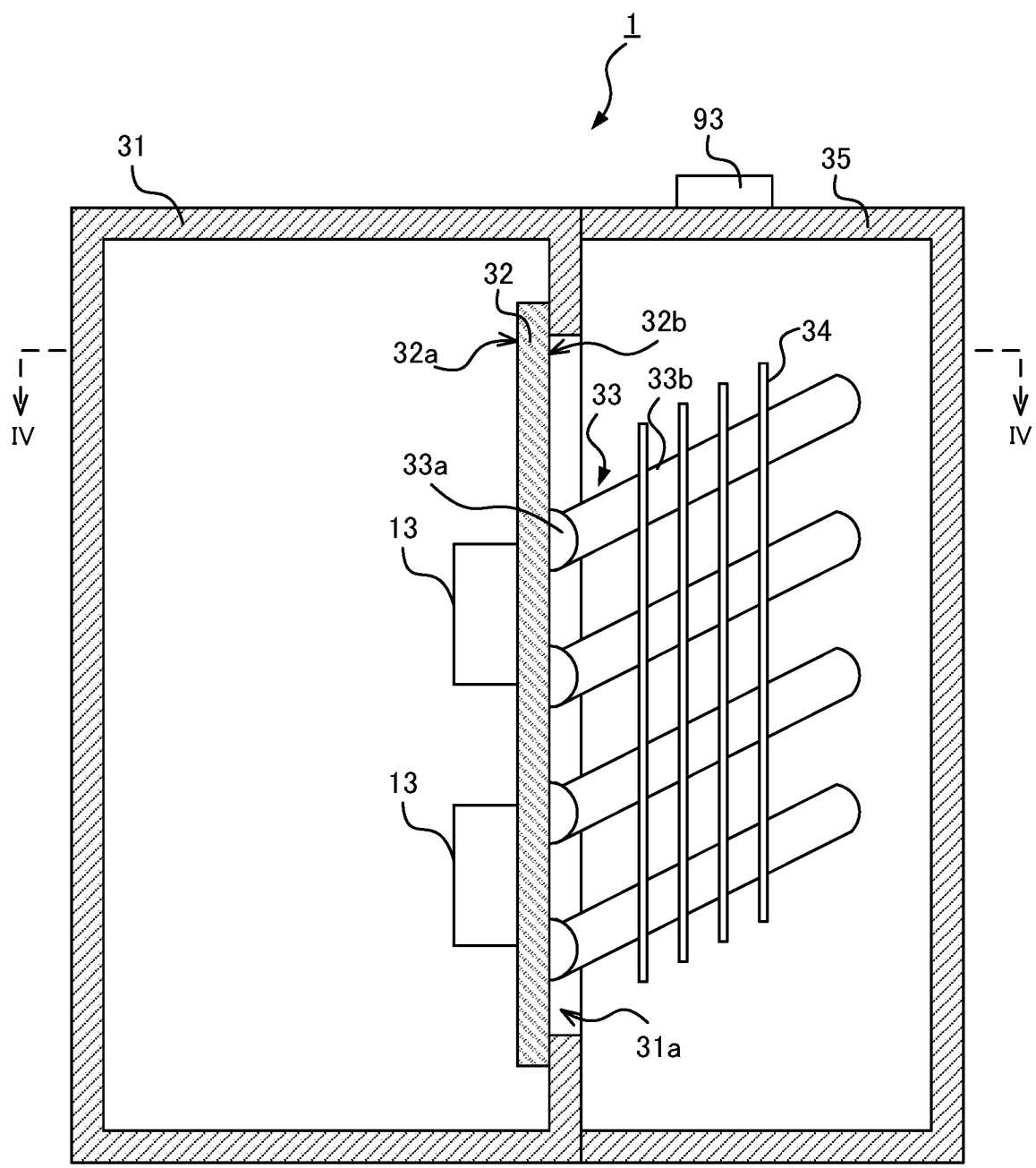
FIG. 2 is a cross-sectional view of the power conversion device according to Embodiment 1.
Figure 3:
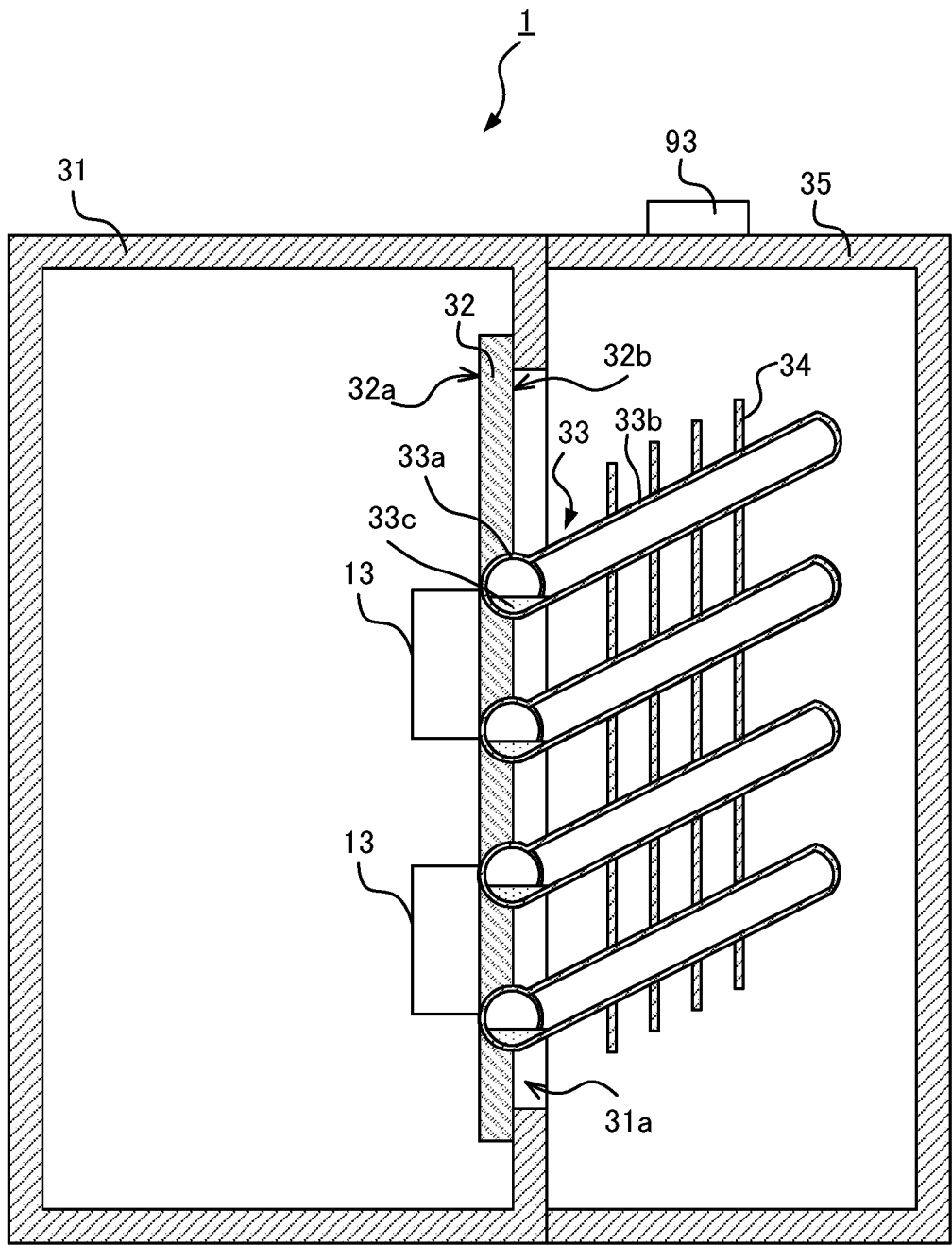
FIG. 3 is a cross-sectional view of the power conversion device according to Embodiment 1.
Figure 4:
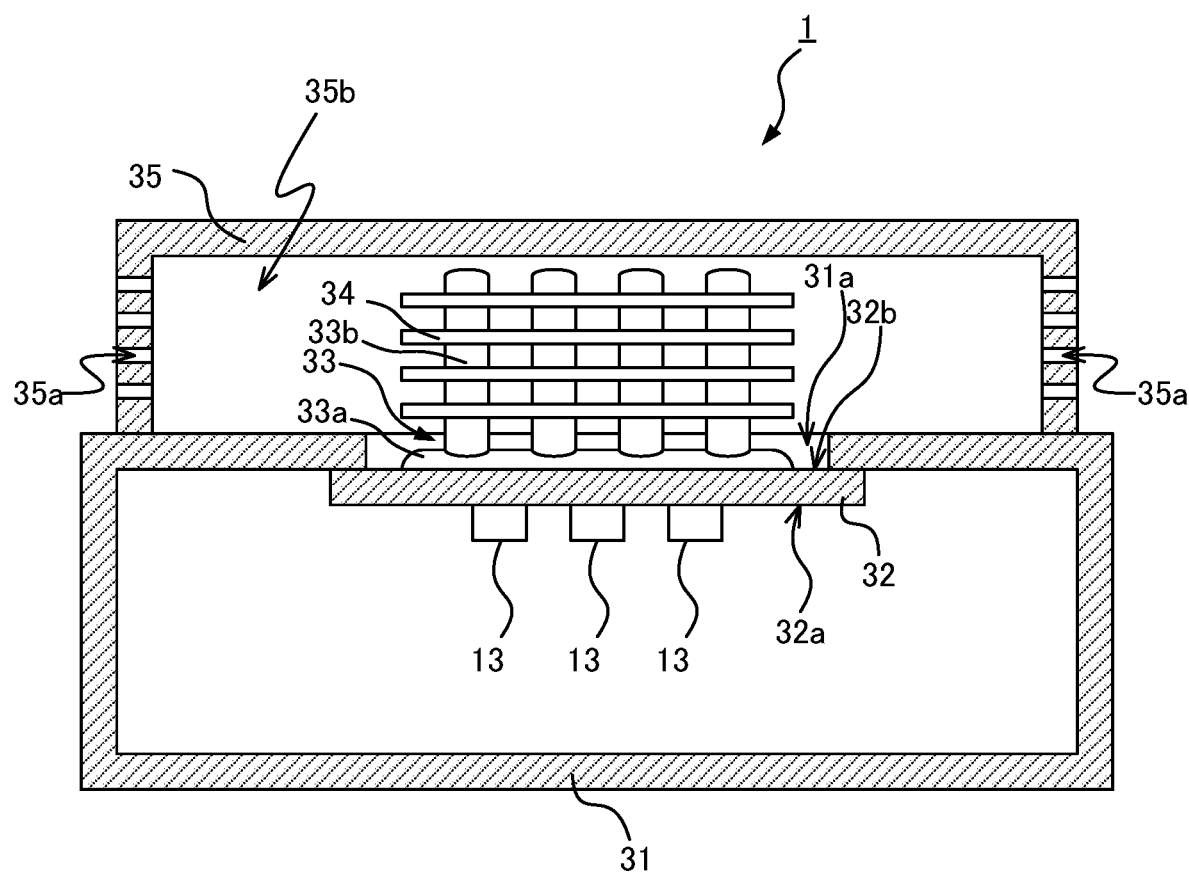
FIG. 4 is a cross-sectional view of the power conversion device according to Embodiment 1, taken along the line IV-IV of FIG. 2.

In FIGS. 2, 3 and 4, in order to simplify illustration, among the structural elements included in the power conversion device 1 illustrated in FIG. 1, only the switching elements 13 are illustrated and the other elements, such as the capacitor C1 and busbars connecting the switching elements 13 and the capacitor C1, are not illustrated. In FIGS. 2 to 4, the X-axis indicates a width direction of the railway vehicle, the Y-axis indicates a travel direction of the railway vehicle, and the Z-axis indicates a direction that is orthogonal to the X-axis and the Y-axis. In the case in which the railway vehicle is located at a level location, the Z-axis indicates a vertical direction.

As illustrated in FIG. 2, the power conversion device 1 includes a housing 31 that houses the power conversion circuit 11, a heat receiving block 32 to which the multiple switching elements 13 are attached, and at least one heat pipe 33 that releases, to air, heat transferred from the multiple switching elements 13 via the heat receiving block 32. The power conversion device 1 preferably further includes multiple fins 34 attached to the at least one heat pipe 33 and a cover 35 that covers the at least one heat pipe 33 and the multiple fins 34.

The housing 31 is attached under a floor of the railway vehicle. The housing 31 has rigidity and strength enough not to deform even by a maximum predictable shaking of the railway vehicle, for example, a maximum shaking of the railway vehicle during travel. The housing 31 is formed of, for example, a metal member such as iron or aluminum. The housing 31 has, on a surface thereof intersecting the X-axis, an opening 31*a*.

The heat receiving block 32 has, on mutually opposite sides, a first main surface 32*a*, and a second main surface 32*b*. The multiple switching elements 13 are attached to the first main surface 32*a*. In Embodiment 1, the multiple switching elements 13 are attached to the first main surface 32*a* with rows of three aligned in the Y-axis direction and rows of two aligned in the Z-axis direction. The at least one heat pipe 33 is attached to the second main surface 32*b*.

The heat receiving block 32 is preferably formed of a material having a high thermal conductivity, for example, a metal such as copper or aluminum. This enables efficiently transferring the heat generated by the multiple switching elements 13 to the at least one heat pipe 33 via the heat receiving block 32.

The heat receiving block 32 is attached to the housing 31 with the opening 31*a* of the housing 31 closed from the inside of the housing 31 by the second main surface 32*b*. The heat receiving block 32 is formed of, for example, a plate-like member of a size capable of closing the opening 31*a*. The heat receiving block 32 closing the opening 31*a* suppresses occurrence of flow of air, moisture, dust and the like into the inside of the housing 31.

The heat receiving block 32 may be attached to the housing 31 strongly enough so that a relative positional relationship between the heat receiving block 32 and the housing 31 does not change even upon undergoing the maximum predictable shaking of the railway vehicle. Specifically, the heat receiving block 32 is attached to an inside surface of the housing 31 by an attachment method such as interlocking, brazing, welding, bonding with an adhesive, fastening with a fastener member, or the like.

Each heat pipe 33 includes a header 33*a* attached to the heat receiving block 32 and multiple branch pipes 33*b* communicating with the header 33*a*. In Embodiment 1, the power conversion device 1 includes four headers 33*a* and sixteen branch pipes 33*b*, each header 33*a* having four attached branch pipes 33*b*.

The header 33*a* is inserted into a groove in the second main surface 32*b* of the heat receiving block 32, such that part of the header 33*a* is exposed, and is attached to the heat receiving block 32 by a freely-selected attachment method such as bonding with an adhesive, soldering, or the like. The header 33a is preferably formed of a material having a high thermal conductivity, for example, a metal such as copper or aluminum.

The branch pipes 33b are attached to the header 33a by welding, soldering, or the like, and communicate with the header 33a. The branch pipes 33b extend in a direction away from the heat receiving block 32, more specifically, in a direction away from the second main surface 32b. The branch pipes 33b are preferably formed of a material having a high thermal conductivity, for example, a metal such as copper or aluminum.

As illustrated in in FIG. 3, a refrigerant 33c is sealed in each heat pipe 33. At ambient temperature, the refrigerant 33c exists in a gas-liquid two-phase state. The refrigerant 33c is a substance such as water that is vaporized by heat transferred from each of the switching elements 13 via the heat receiving block 32 and that is liquefied by release of heat to air around the heat pipe 33 via the heat pipe 33 and the fins 34.

As illustrated in FIGS. 2 to 4, each of the fins 34 is formed of a plate-like member. The fins 34 each have multiple through-holes and are attached to the branch pipes 33b with the branch pipes 33b inserted into the through-holes. The fins 34 are preferably formed of a material having a high thermal conductivity, for example, a metal such as copper or aluminum. Each of the fins 34 has a main surface extending along the travel direction of the railway vehicle, that is, the Y-axis direction. This configuration allows air flowing toward the rear part of the railway vehicle during travel of the railway vehicle to smoothly flow between the fins 34, causing an increase in cooling performance of the power conversion device 1.

As illustrated in FIG. 4, the cover 35 has two mutually-opposing surfaces that are each equipped with multiple intake/exhaust ports 35a. The cover 35 is attached to the housing 31 so as to cover the at least one heat pipe 33 and the multiple fins 34. The cover 35 defines, with the housing 31, a duct 35b through which air outside of the housing 31 flows.

The air outside of the housing 31 flows into an inside of the cover 35 through the multiple intake/exhaust ports 35a formed in one surface of surfaces of the cover 35 that are orthogonal to the Y-axis. The air flowing into the inside of the cover 35 flows in the Y-axis direction while contacting the heat pipe 33 and the fins 34 and is exhausted through the multiple intake/exhaust ports 35a formed in the other surface of the surfaces of the cover 35 that are orthogonal to the Y-axis. The heat generated by the multiple switching elements 13 is transferred to the air via the heat receiving block 32, the heat pipe 33 and the fins 34. Upon transfer to the air of the heat generated by the multiple switching elements 13, the multiple switching elements 13 are cooled.

As illustrated in FIG. 3, the temperature sensor 93 is attached to an outer surface of the cover 35. This configuration allows the temperature sensor 93 to measure a temperature of the air outside of the housing 31. In Embodiment 1, the temperature sensor 93 is attached to an upper side surface of the cover 35 with respect to the vertical direction.

A mechanism for cooling the multiple switching elements 13 in the power conversion device 1 having the aforementioned configuration is described. Upon generation of heat by the multiple switching elements 13, heat is transferred from the multiple switching elements 13 to the refrigerant 33c via the heat receiving block 32 and the header 33a. This results in an increase in a temperature of the refrigerant 33c and vaporization of apart of the refrigerant 33c. The vaporized refrigerant 33c flows from the header 33a to the branch pipes 33b and moves through the inside of the branch pipes 33b toward upper ends of the branch pipes 33b with respect to the vertical direction.

While moving through the inside of the branch pipes 33b toward the upper ends of the branch pipes 33b with respect to the vertical direction, the refrigerant 33c releases heat to the air around the heat pipe 33 via the branch pipes 33b and the fins 34. The air around the heat pipe 33 is the air outside of the housing 31 flowing into the inside of the cover 35 via the intake/exhaust ports 35a of the cover 35. Upon release of heat from the refrigerant 33c to the air, the temperature of the refrigerant 33c decreases and the refrigerant 33c liquefies. The liquefied refrigerant 33c is transferred along inner walls of the branch pipes 33b and returns to the header 33a. The liquefied refrigerant 33c is vaporized again upon transfer thereto of heat from the multiple switching elements 13 via the heat receiving block 32, and then flows into the branch pipes 33b and moves toward the upper ends of the branch pipes 33b with respect to the vertical direction. By repeated circulation of the refrigerant 33c through vaporization and liquefaction as described above, the heat generated by the multiple switching elements 13 is released to the air around the heat pipe 33 and the multiple switching elements 13 are cooled.

A temperature difference occurs in non-vaporized refrigerant 33c among the refrigerant 33c to which the heat is transferred from the multiple switching elements 13, that is, in the refrigerant 33c in a liquid-state. Specifically, a temperature of the refrigerant 33c located near the switching elements 13 is higher than a temperature of the refrigerant 33c located farther from the switching elements 13. This difference produces convection in the liquid-state refrigerant 33c. Y-axis direction diffusion and transfer of heat from the multiple switching elements 13 are enabled by this convection of the refrigerant 33c, thus enabling efficient cooling of the multiple switching elements 13.

A temperature of the air around the heat pipe 33 equal to or lower than 0 degrees Celsius may possibly cause freezing of the refrigerant 33c that is water. Cooling the multiple switching elements 13 with the refrigerant 33c frozen is unachievable since the aforementioned circulation and convection of the refrigerant 33c do not occur. A mechanism for suppressing occurrence of a decrease in the cooling performance of the power conversion device 1 due to freezing of the refrigerant 33c is described below.

To suppress occurrence of a decrease in the cooling performance of the power conversion device 1, the controller 12 adjusts, based on the operational status of the load equipment and the temperature of the air, a switching loss of the multiple switching elements 13. An increase in the switching loss occurring during the switching operations of the multiple switching elements 13 leads to a high amount of heat generation of the multiple switching elements 13. In Embodiment 1, the controller 12 uses the rotation speed of the electric motor 91 as an indicator of the operational status of the load equipment. A decrease in the rotation speed of the electric motor 91 leads to a decrease in output from the power conversion circuit 11, resulting in a decrease in the amount of the heat generation of each of the switching elements 13. Conversely, an increase in the rotation speed of the electric motor 91 leads to an increase in the output from the power conversion circuit 11, resulting in an increase in the amount of the heat generation of each of the switching elements 13.

For the aforementioned reasons, a possibility that a decrease in the rotation speed of the electric motor 91 causes freezing of the refrigerant 33c is high in a case in which the temperature of the air outside of the housing 31 is equal to or lower than a temperature at which the refrigerant 33c is freezable, for example, in the case in which the air outside of the housing 31 is equal to or lower than 0 degrees Celsius. Thus, when the rotation speed of the electric motor 91 is within a range of rotational speeds associated with a low-speed range of the railway vehicle and the temperature of the air outside of the housing 31 is equal to or lower than the temperature at which the refrigerant 33c is freezable, the controller 12 causes an increase in the amount of the heat generation of the multiple switching elements 13, in order to suppress occurrence of freezing of the refrigerant 33c. The low speed range of the railway vehicle indicates, for example, a range of speeds of the railway vehicle equal to or lower than 30 kilometers per hour. In this case, the "range of rotational speeds associated with a low-speed range of the railway vehicle" is a range of speeds equal to or lower than a first threshold rotation speed that is a rotation speed of the electric motor 91 at which the railway vehicle travels at 30 kilometers per hour.

The controller 12 is described in detail with reference to FIG. 5. The controller 12 includes a torque command determination circuit 21 that determines, based on the operation command S1 and the measurement value of the rotation speed of the electric motor 91 that is acquired from the speed sensor 92, a torque command value τ* that is a target value of a torque of the electric motor 91, and a position estimator 22 that estimates a rotor position of the electric motor 91 by integrating the measurement value of the rotation speed of the electric motor 91 and outputs an estimated position θ.

The controller 12 further includes a coordinate converter 23 that (i) determines an excitation current value id and a torque current value iq by performing, based on the estimated position θ, conversion of the U-phase current, the V-phase current and the W-phase current that are acquired from the current sensors CT1, CT2 and CT3, from the three-phrase coordinate system to the dq-rotating coordinate system and (ii) outputs the excitation current value id and the torque current value iq, and a current command determination circuit 24 that determines, based on the torque command value τ*, an excitation current command value id* and a torque current command value iq*, and outputs the excitation current command value id* and the torque current command value iq*.

The controller 12 further includes a current control circuit 25 that determines an excitation voltage command value Vd* from a difference between the excitation current value id and the excitation current command value id*, determines a torque voltage command value Vq* from a difference between the torque current value iq and the torque current command value iq*, and outputs the excitation voltage command value Vd* and the torque voltage command value Vq*.

The controller 12 further includes a coordinate converter 26 that (i) determines a U-phase voltage command value Vu, a V-phase voltage command value Vv and a W-phase voltage command value Vw by performing, based on the estimated position θ, conversion of the excitation voltage command value Vd* and the torque voltage command value Vq* from the dq-rotating coordinate system to the three-phrase coordinate system and (ii) outputs the U-phase voltage command value Vu, the V-phase voltage command value Vv and the W-phase voltage command value Vw. The U-phase voltage command value Vu, the V-phase voltage command value Vv and the W-phase voltage command value Vw that are outputted by the coordinate converter 26 are each expressed as a sine wave.

The controller 12 further includes a triangular wave generation circuit 27 that generates and outputs a triangular wave as a carrier wave. When the railway vehicle travels at a speed within the low speed range, the triangular wave generation circuit 27 operates in an asynchronous mode in which a frequency of the triangular wave is a frequency that is not based on the rotation speed of the electric motor 91, in other words, is set to a frequency determined independently of the rotation speed of the electric motor 91. In the asynchronous mode, when the temperature of the air outside of the housing 31 is equal to or lower than the temperature at which the refrigerant 33c is freezable, the frequency of the triangular wave is set to a frequency that is higher than in the case in which the temperature of the air outside of the housing 31 is higher than the temperature at which the refrigerant 33c is freezable. An increase in the switching frequency due to the increase in the frequency of the triangular wave leads to an increase in the switching loss of each of the switching elements 13 and therefore leads to an increase in the amount of the heat generation of each of the switching elements, and as a result, occurrence of freezing of the refrigerant 33c is suppressed.

When the railway vehicle travels at a speed higher than the low speed range, the triangular wave generation circuit 27 operates in a synchronous mode in which the frequency is set based on the rotation speed of the electric motor 91. Specifically, in the synchronous mode, the frequency of the triangular wave is set to a value of a natural number multiple of frequencies of the sine waves expressing the U-phase voltage command value Vu, the V-phase voltage command value Vv and the W-phase voltage command value Vw.

The controller 12 further includes a PWM signal generation circuit 28 that generates, by comparing each of the U-phase voltage command value Vu, the V-phase voltage command value Vv and the W-phase voltage command value Vw with the triangular wave, the switching control signals S2 that are each a pulse width modulation (PWM) signal. Since the frequency of the triangular wave is higher than or equal to any of the frequencies of the U-phase voltage command value Vu, the V-phase voltage command value Vv and the W-phase voltage command value Vw, the switching frequency that is a frequency of the switching control signals S2 is determined by the triangular wave outputted by the triangular wave generation circuit 27.

Figure 6:
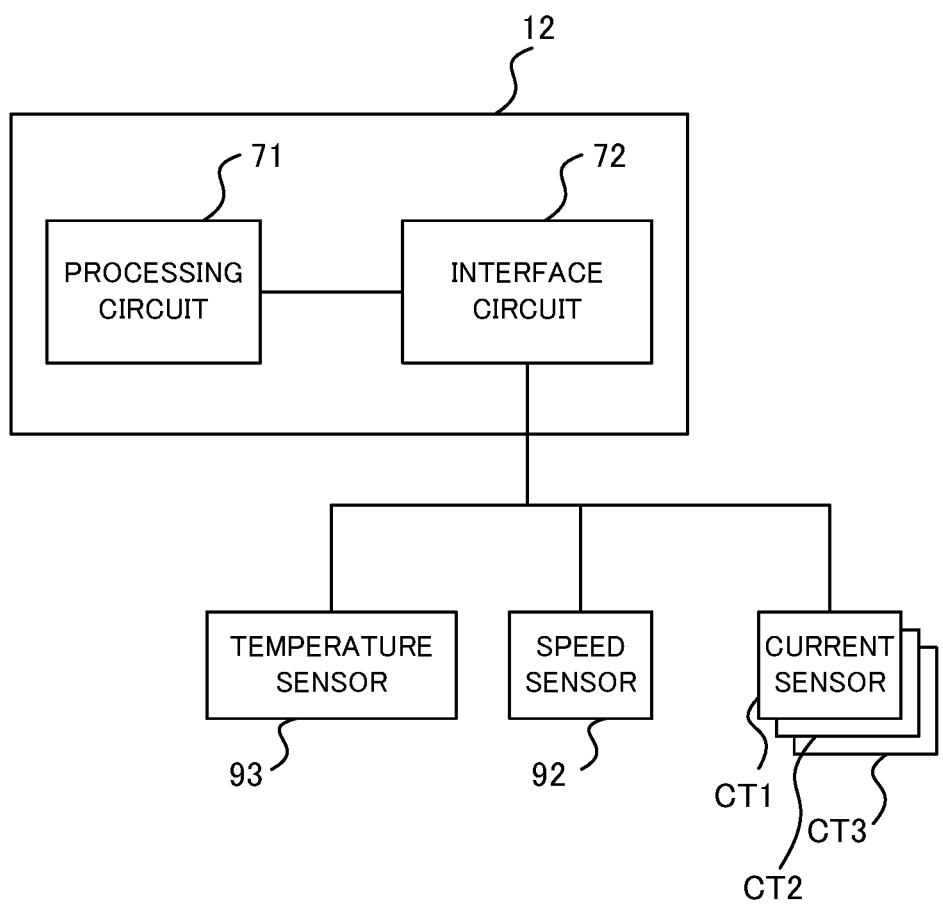
FIG. 6 is a block diagram illustrating hardware configuration of the controller according to Embodiment 1.

The controller 12 having the aforementioned configuration is achieved by a processing circuit 71, as illustrated in FIG. 6. The processing circuit 71 is connected to the speed sensor 92, the temperature sensor 93 and the current sensors CT1, CT2 and CT3 via an interface circuit 72. In a case in which the processing circuit 71 is dedicated hardware, the processing circuit 71 includes, for example, a single circuit, a combined circuit, a processor, an application specific integrated circuit (ASIC), a field programmable gate array (FPGA), a combination thereof, or the like. Each of the elements of the controller 12 may be achieved by individual processing circuits 71, or each of the elements of the controller 12 may be achieved by a common processing circuit 71.

Figure 7:
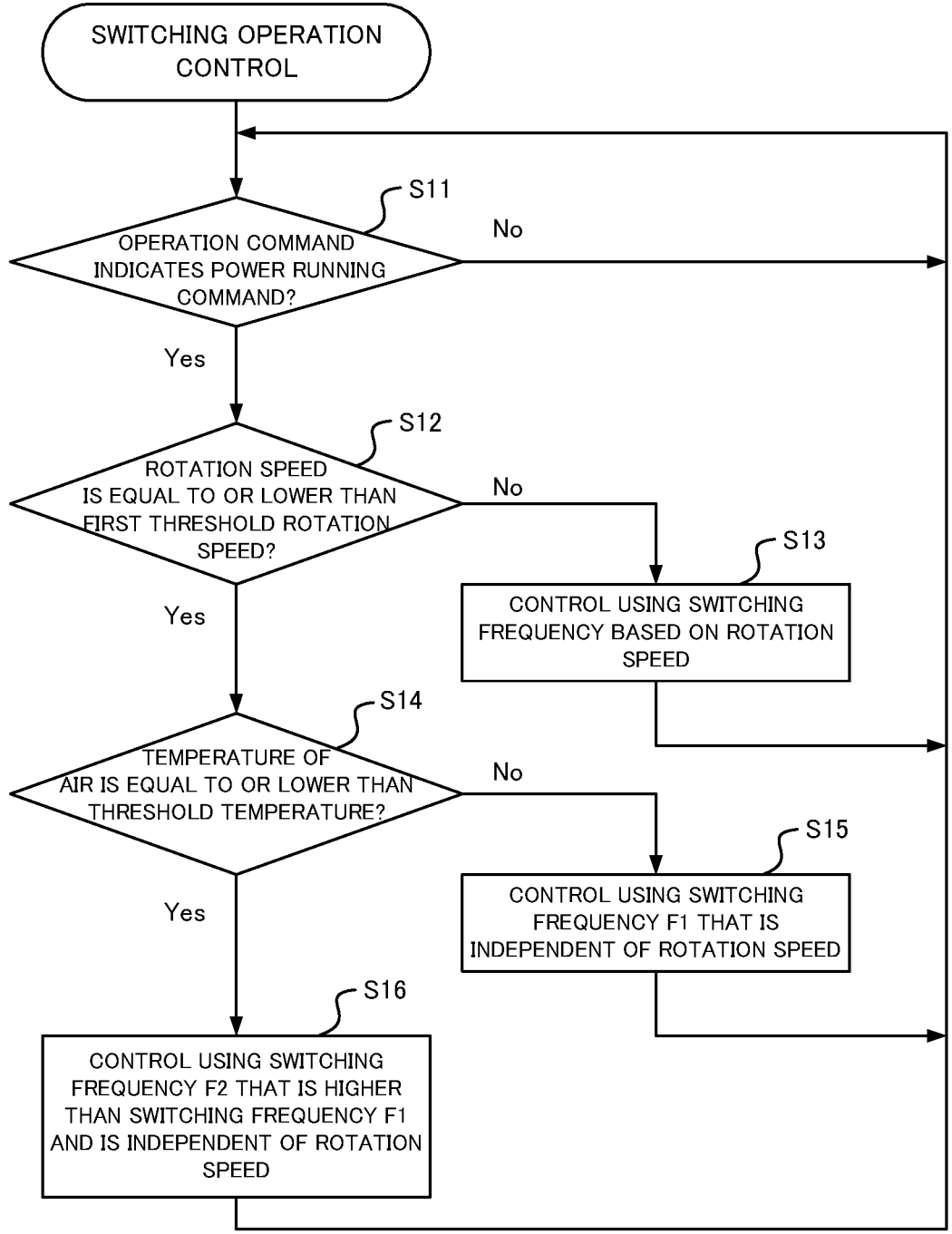
FIG. 7 is a flowchart of switching operation control processing executed by the controller according to Embodiment 1.

Processing for control of the switching operation of each of the switching elements 13 that is executed by the controller 12 having the aforementioned configuration is described with reference to FIG. 7. Upon acquiring the operation command S1 from the driver cab, the controller 12 starts the operation illustrated in FIG. 7. When the operation command S1 does not indicate the power running command (NO in step S11), the processing in step S11 is repeatedly executed. When the operation command S1 indicates the power running command (YES in step S11) and the measurement value of the rotation speed of the electric motor 91 is higher than the first threshold rotation speed (NO in step S12), the controller 12 controls the switching elements 13 using a switching frequency that is based on the rotation speed of the electric motor 91 (step S13). Thereafter, the aforementioned processing is repeatedly executed from step S11.

Figure 8:
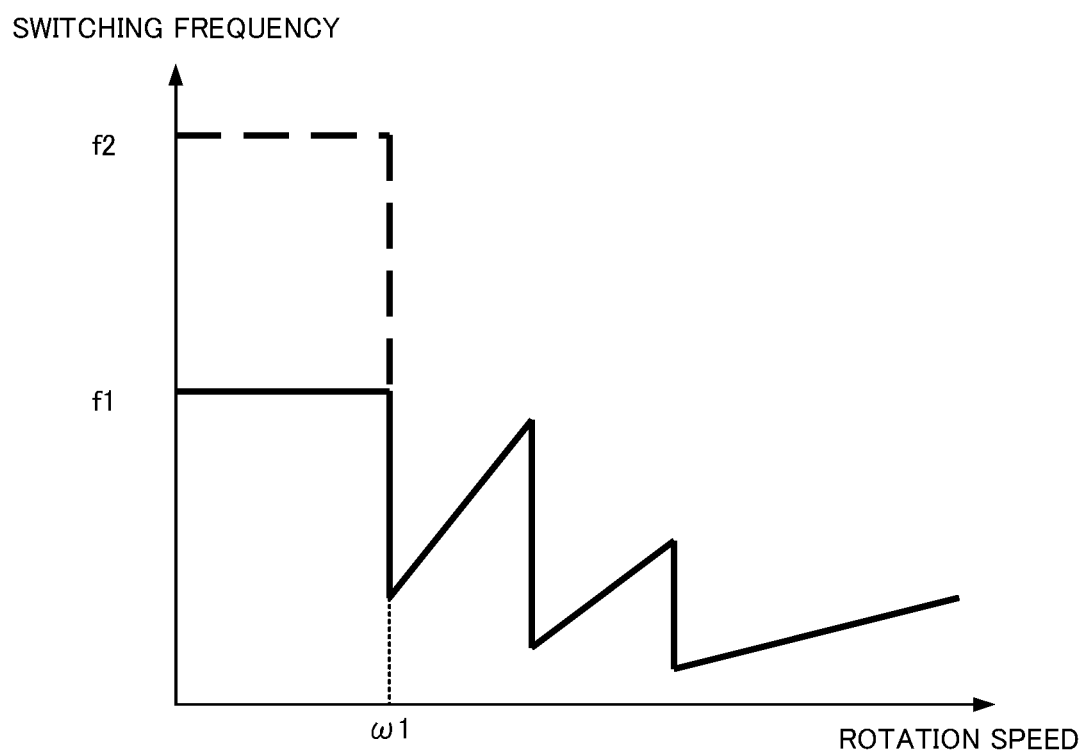
FIG. 8 illustrates a relationship between a rotation speed of an electric motor and a switching frequency according to Embodiment 1.

The processing in step S13 is described below in detail. As illustrated in FIG. 8, when the measurement value of the rotation speed of the electric motor 91 that is acquired from the speed sensor 92 is higher than a first threshold rotation speed ω1, the triangular wave generation circuit 27 operates in the synchronous mode and outputs the triangular wave having a frequency that increases or decreases based on a change in the rotation speed of the electric motor 91. The first threshold rotation speed ω1 is a rotation speed of the electric motor 91 at which the speed of the railway vehicle is identical to an upper limit of the low speed range. In FIG. 8, the horizontal axis indicates the rotation speed of the electric motor 91, and the vertical axis indicates the switching frequency.

The PWM signal generation circuit 28 generates the switching control signals S2 by comparing each of the U-phase voltage command value Vu, the V-phase voltage command value Vv and the W-phase voltage command value Vw with the triangular wave. The switching frequency that is the frequency of the switching control signals S2 is determined by the frequency of the triangular wave. The frequency of the triangular wave is a value determined by the rotation speed of the electric motor 91, as described above. This configuration allows the controller 12 to control the switching elements 13 using the switching frequency that is based on the rotation speed of the electric motor 91.

When the operation command S1 indicates the power running command (YES in step S11 of FIG. 7), the measurement value of the rotation speed of the electric motor 91 is equal to or lower than the first threshold rotation speed (YES in step S12), and the measurement value of the temperature of the air outside of the housing 31 that is acquired from the temperature sensor 93 is higher than the threshold temperature (NO in step S14), the processing in step S15 is executed. Specifically, the controller 12 controls the switching elements 13 using a switching frequency f1 that is independent of the rotation speed of the electric motor 91 (step S15). Thereafter, the aforementioned processing is repeatedly executed from step S11.

The threshold temperature used for determination in step S14 is determined based on the temperature at which the refrigerant 33c is freezable. For example, in the case in which the refrigerant 33c is water, the threshold temperature is set to 0 degrees Celsius.

The processing in step S15 is described below in detail. As illustrated in FIG. 8, when the measurement value of the rotation speed of the electric motor 91 that is acquired from the speed sensor 92 is equal to or lower than the first threshold rotation speed ω1, the triangular wave generation circuit 27 operates in the asynchronous mode. In the asynchronous mode, when the measurement value of the temperature of the air outside of the housing 31 is higher than the threshold temperature, the triangular wave generation circuit 27 outputs the triangular wave having the fixed frequency f1 that is independent of the rotation speed of the electric motor 91.

The PWM signal generation circuit 28 generates the switching control signals S2 by comparing each of the U-phase voltage command value Vu, the V-phase voltage command value Vv and the W-phase voltage command value Vw with the value of the triangular wave. The switching frequency that is the frequency of the switching control signals S2 is determined by the frequency of the triangular wave. The frequency of the triangular wave is a fixed value f1 that is independent of the rotation speed of the electric motor 91, as described above. This configuration allows the controller 12 to control the switching elements 13 using the switching frequency f1 that is independent of the rotation speed of the electric motor 91.

When the operation command S1 indicates the power running command (YES in step S11 of FIG. 7), the measurement value of the rotation speed of the electric motor 91 is equal to or lower than the first threshold rotation speed (YES in step S12), and the measurement value of the temperature of the air outside of the housing 31 that is acquired from the temperature sensor 93 is equal to or lower than the threshold temperature (YES in step S14), the processing in step S16 is executed. Specifically, the controller 12 controls the switching elements 13 using a switching frequency f2 that is higher than the switching frequency f1 and that is independent of the rotation speed of the electric motor 91 (step S16). Thereafter, the aforementioned processing is repeatedly executed from step S11.

The processing in step S16 is described below in detail. As illustrated in FIG. 8, when the measurement value of the rotation speed of the electric motor 91 that is acquired from the speed sensor 92 is equal to or lower than the first threshold rotation speed ω1, the triangular wave generation circuit 27 operates in the asynchronous mode. In the asynchronous mode, when the measurement value of the temperature of the air outside of the housing 31 is equal to or lower than the threshold temperature, the triangular wave generation circuit 27 outputs the triangular wave having the fixed frequency f2 that is independent of the rotation speed of the electric motor 91. The frequency f2 is set to a value higher than the frequency f1. For example, the frequency f2 is twice the frequency f1.

The PWM signal generation circuit 28 generates the switching control signals S2 by comparing each of the U-phase voltage command value Vu, the V-phase voltage command value Vv and the W-phase voltage command value Vw with the value of the triangular wave. The switching frequency that is the frequency of the switching control signals S2 is determined by the frequency of the triangular wave. The frequency of the triangular wave is the fixed value f2 that is independent of the rotation speed of the electric motor 91, as described above. Due to this configuration, the switching frequency of each of the switching elements 13 is set to the switching frequency f2 that is independent of the rotation speed of the electric motor 91. As described above, when the measurement value of the rotation speed of the electric motor 91 is equal to or lower than the first threshold rotation speed ω1 and the measurement value of the temperature of the air outside of the housing 31 is equal to or lower than the threshold temperature, the controller 12 causes the switching frequency to be increased to the frequency f2 and controls each of the switching elements 13 based on the increased frequency, that is, the frequency f2.

As described above, when the measurement value of the rotation speed of the electric motor 91 is equal to or lower than the first threshold rotation speed and the measurement value of the temperature of the air outside of the housing 31 is equal to or lower than the threshold temperature, the controller 12 included in the power conversion device 1 according to Embodiment 1 controls the switching elements 13 using the switching frequency f2 that is independent of the rotation speed of the electric motor 91. Since the switching frequency f2 is higher than the switching frequency f1, executing switching control based on the switching frequency f2 leads to a larger switching loss of each of the switching elements 13 and therefore leads to a larger amount of the heat generation of each of the switching elements 13 than in the case of executing switching control based on the switching frequency f1.

Setting the switching frequency f2 to be higher than the frequency that is based on the rotation speed of the electric motor 91 as described above leads to a higher amount of the heat generation of each of the switching elements 13, in the case in which (i) the measurement value of the rotation speed of the electric motor 91 is equal to or lower than the first threshold rotation speed and (ii) the measurement value of the temperature of the air outside of the housing 31 is equal to or lower than the threshold temperature, than in the case in which (i) the measurement value of the rotation speed of the electric motor 91 is higher than the first threshold rotation speed or (ii) the measurement value of the temperature of the air outside of the housing 31 is higher than the threshold temperature.

The increase in the amount of the heat generation of each of the switching elements 13 suppresses occurrence of freezing of the refrigerant 33c when the measurement value of the temperature of the air outside of the housing 31 is equal to or lower than the threshold temperature. This configuration suppresses occurrence of a decrease in the performance of cooling the switching elements 13 due to interference with circulation of the refrigerant 33c resulting from the freezing of the refrigerant 33c and therefore improves the cooling performance of the power conversion device 1.

Even in the case in which the measurement value of the temperature of the air outside of the housing 31 is equal to or lower than the threshold temperature, when the measurement value of the rotation speed of the electric motor 91 is higher than the first threshold rotation speed, the controller 12 controls each of the switching elements 13 using the switching frequency that is based on the rotation speed of the electric motor 91, that is, using a frequency lower than the switching frequency f2. This configuration prevents the amount of the heat generation of each of the switching elements 13 from being increased more than is needed. In other words, during travel of the railway vehicle in which the power conversion device 1 is installed, each of the switching elements 13 can be cooled sufficiently.

Embodiment 2

The parameter of the switching operations that contributes to increase and decrease in the amount of the heat generation of the multiple switching elements 13 is not limited to the switching frequency. In Embodiment 2, while focusing on differences from the power conversion device 1 according to Embodiment 1, a power conversion device is described in which the excitation current command value id* that is another example of the parameter is increased to increase the amount of the heat generation of the multiple switching elements 13.

Figure 9:
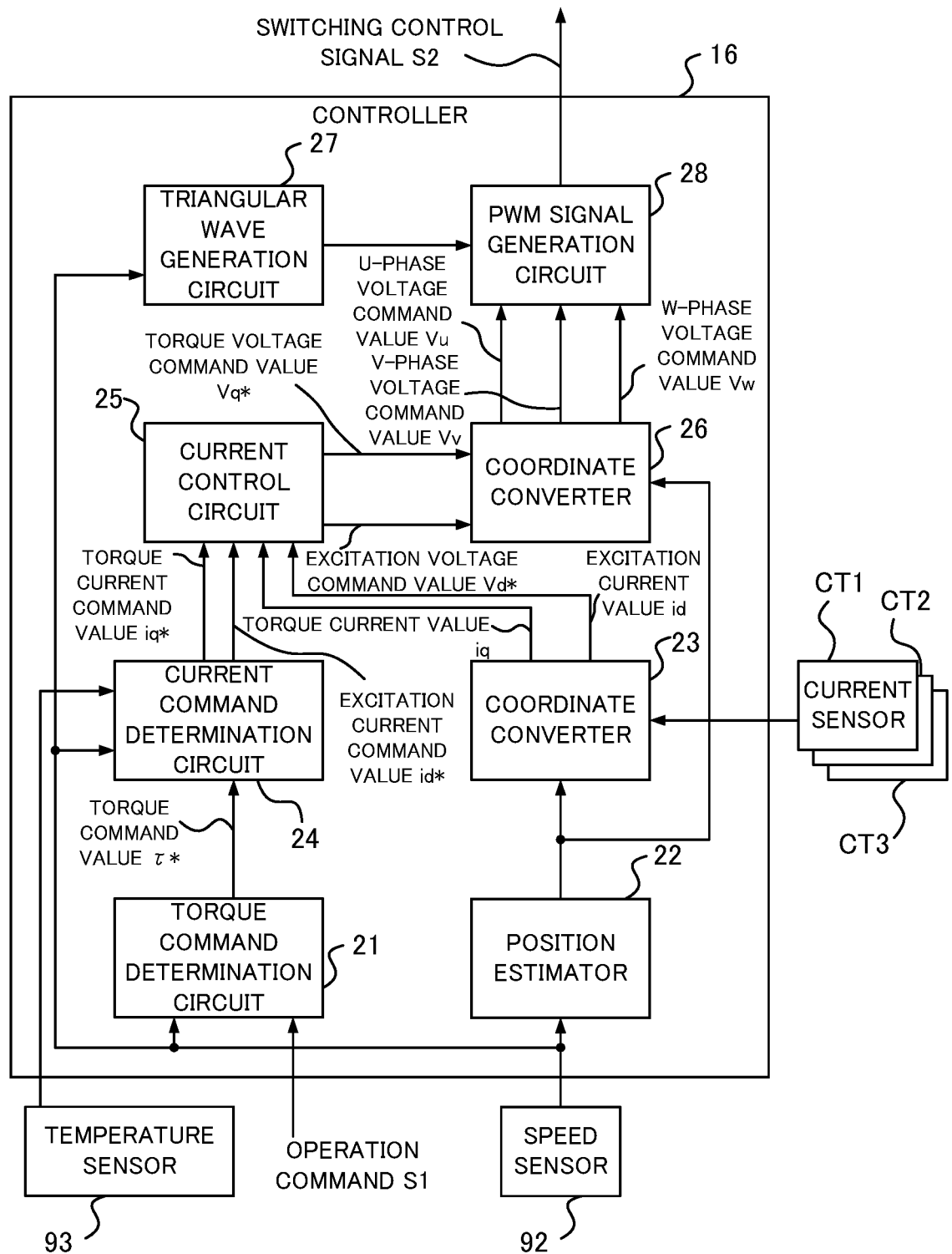
FIG. 9 is a block diagram of a controller according to Embodiment 2.

A power conversion device 1 according to Embodiment 2 has a configuration that is basically similar to the configuration of the power conversion device 1 according to Embodiment 1 but is different from the power conversion device 1 according to Embodiment 1 in that a controller 16 is included as illustrated in FIG. 9. The controller 16 adjusts the excitation current command value that is an example of the parameter that contributes to increase and decrease in the amount of the heat generation of the multiple switching elements 13, such that (i) the target voltage is outputted from the power conversion circuit 11 and (ii) an amount of the heat generation of the multiple switching elements 13 is obtained that is based on the measurement value of the rotation speed of the electric motor 91 and the temperature of the air outside of the power conversion device 1.

Figure 5:
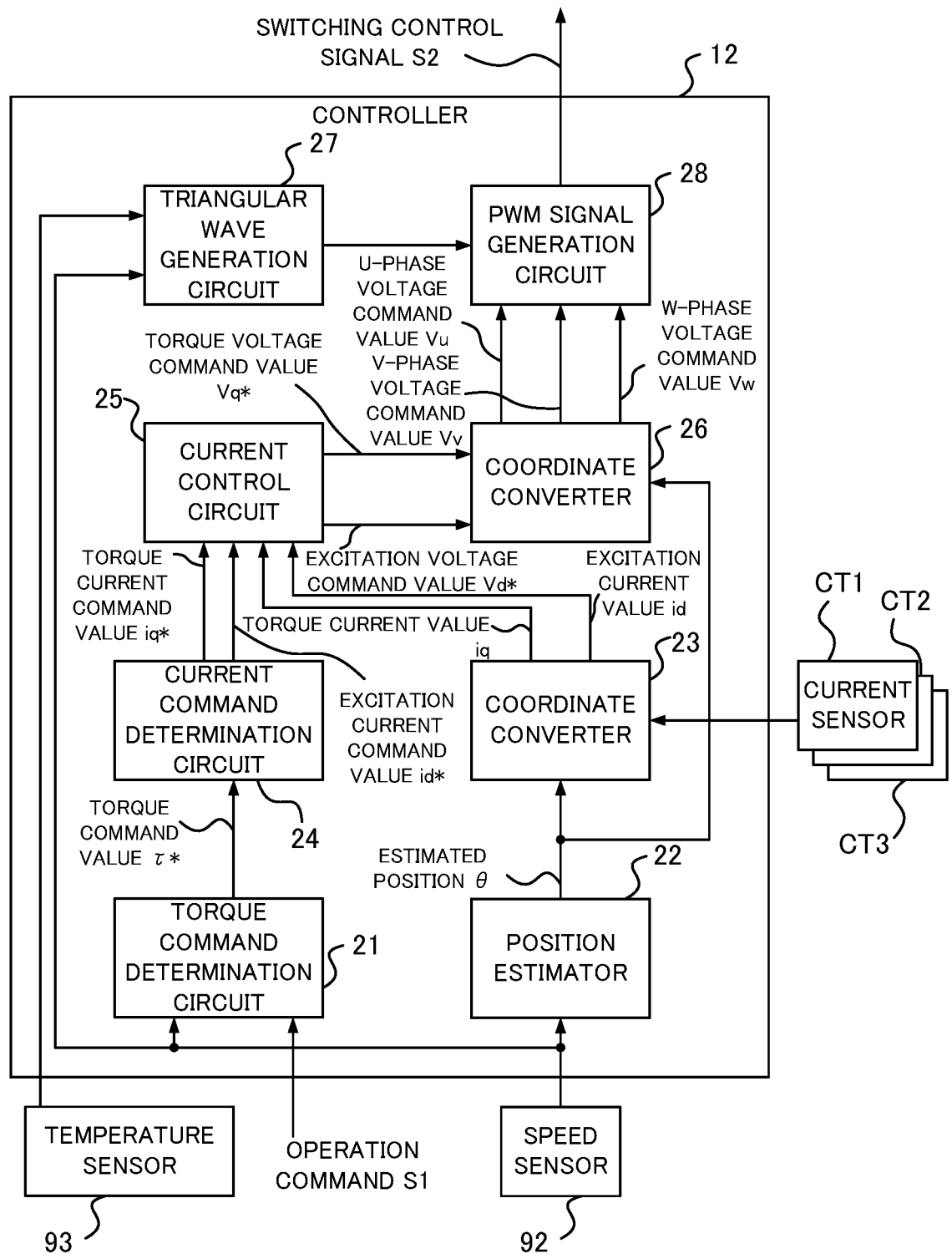
FIG. 5 is a block diagram of a controller according to Embodiment 1.

Although the controller 16 illustrated in FIG. 9 is basically similar to the controller 12 illustrated in FIG. 5 in configuration and an operation of each element, operations of the current command determination circuit 24 and the triangular wave generation circuit 27 are different from those of the controller 12.

The current command determination circuit 24 determines, based on the torque command value $\tau^*$, the excitation current command value id* and the torque current command value iq*. When the measurement value of the rotation speed of the electric motor 91 is equal to or lower than the first threshold rotation speed and the measurement value of the temperature of the air outside of the housing 31 is equal to or lower than the threshold temperature, the current command determination circuit 24 increases the excitation current command value id* and outputs the increased excitation current command value id* and the torque current command value iq* that is determined based on the torque command value $\tau^*$. When the measurement value of the rotation speed of the electric motor 91 is higher than the first threshold rotation speed or when the measurement value of the temperature of the air outside of the housing 31 is higher than the threshold temperature, the current command determination circuit 24 outputs the excitation current command value id* and the torque current command value iq* that are determined based on the torque command value $\tau^*$.

When the measurement value of the rotation speed of the electric motor 91 is higher than the first threshold rotation speed, the triangular wave generation circuit 27 outputs a triangular wave of a frequency that is based on the rotation speed of the electric motor 91. When the measurement value of the rotation speed of the electric motor 91 is equal to or lower than the first threshold rotation speed, the triangular wave generation circuit 27 outputs a triangular wave having the frequency f1 that is independent of the rotation speed of the electric motor 91.

Figure 10:
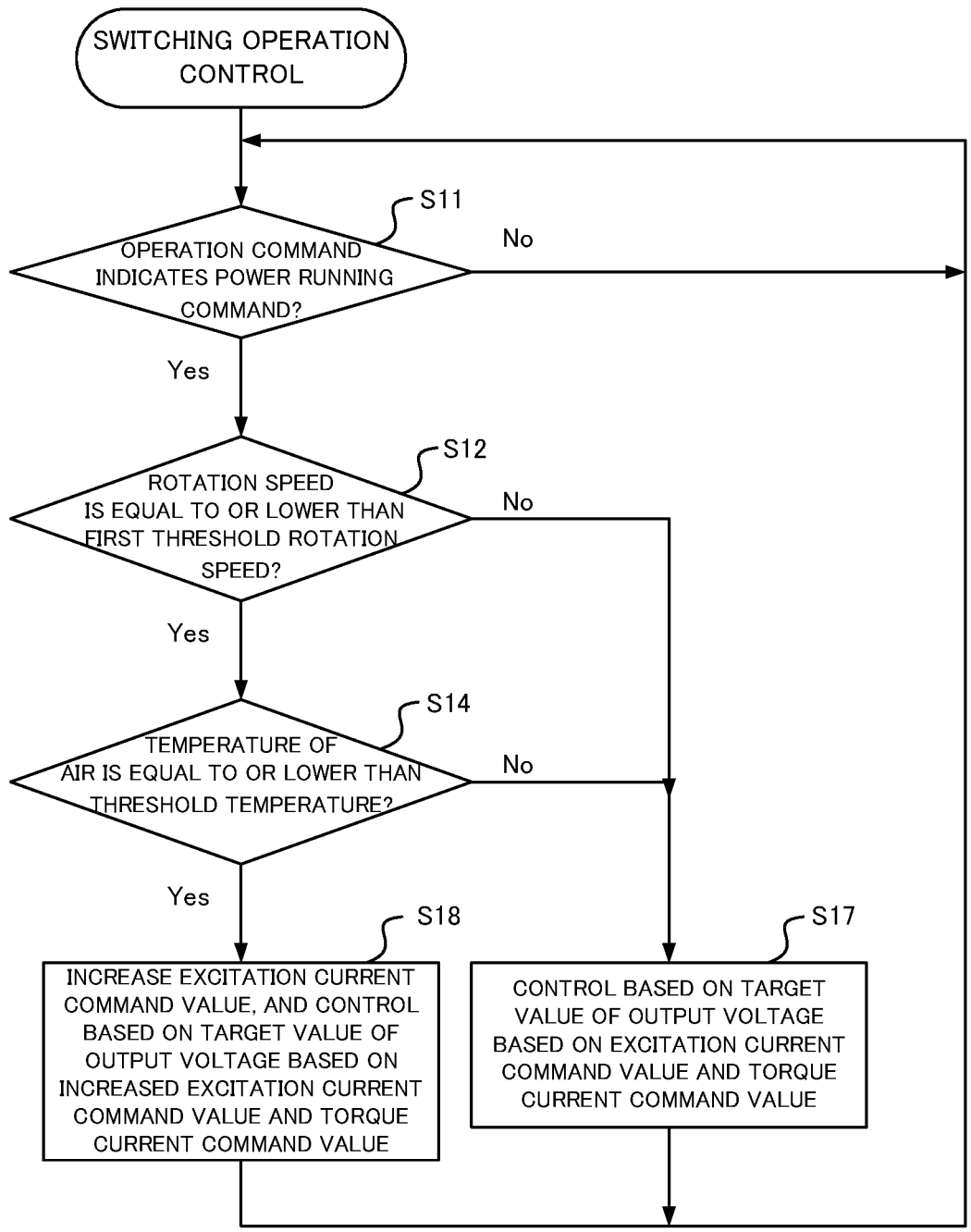
FIG. 10 is a flowchart of switching operation control processing executed by the controller according to Embodiment 2.

Processing for control of the switching operation of each of the switching elements 13 that is executed by the controller 16 having the aforementioned configuration is described with reference to FIG. 10. Upon acquiring the operation command S1 from the driver cab, the controller 16 starts the operation illustrated in FIG. 10. Processing in steps S11 and S12 is similar to that executed by the controller 12 of the power conversion device 1 according to Embodiment 1 that is illustrated in FIG. 7. When the measurement value of the rotation speed of the electric motor 91 is higher than the first threshold rotation speed (NO in step S12), or when the measurement value of the rotation speed of the electric motor 91 is equal to or lower than the first threshold rotation speed (YES in step S12) and the measurement value of the temperature of the air outside of the housing 31 that is acquired from the temperature sensor 93 is higher than the threshold temperature (NO in step S14), the processing in step S17 is executed. Specifically, the controller 16 controls each of the switching elements 13 based on a target value of the output voltage of the power conversion circuit 11 that is based on the excitation current command value id* and the torque current command value iq* that are determined based on the torque command value τ* (step S17). Thereafter, the aforementioned processing is repeatedly executed from step S11.

The processing in step S17 is described below in detail. The current command determination circuit 24 determines the excitation current command value id* and the torque current command value iq* based on the torque command value τ* and outputs the excitation current command value id* and the torque current command value iq*. The current control circuit 25 determines the excitation voltage command value Vd* from a difference between the excitation current value id and the excitation current command value id* based on the torque command value τ*, determines the torque voltage command value Vq* from a difference between the torque current value iq and the torque current command value iq* based on the torque command value τ*, and outputs the excitation voltage command value Vd* and the torque voltage command value Vq*.

The coordinate converter 26 (i) determines the U-phase voltage command value Vu, the V-phase voltage command value Vv and the W-phase voltage command value Vw by performing, based on the estimated position θ, conversion of the excitation voltage command value Vd* and the torque voltage command value Vq* from the dq-rotating coordinate system to the three-phrase coordinate system and (ii) outputs the U-phase voltage command value Vu, the V-phase voltage command value Vv and the W-phase voltage command value Vw. The PWM signal generation circuit 28 generates the switching control signals S2 by comparing each of the U-phase voltage command value Vu, the V-phase voltage command value Vv and the W-phase voltage command value Vw with the triangular wave. As a result, the controller 16 can control each of the switching elements 13 based on the target value of the output voltage of the power conversion circuit 11 that is based on the excitation current command value id* and the torque current command value iq* that are determined based on the torque command value τ*.

When the measurement value of the rotation speed of the electric motor 91 is equal to or lower than the first threshold rotation speed (YES in step S12) and the measurement value of the temperature of the air outside of the housing 31 that is acquired from the temperature sensor 93 is equal to or lower than the threshold temperature (YES in step S14), the processing in step S18 is executed. Specifically, the controller 16 increases the excitation current command value id* that is based on the torque command value τ*, and controls each of the switching elements 13 based on the target value of the output voltage of the power conversion circuit 11 that is based on the increased excitation current command value id* and the torque current command value iq* (step S18). Thereafter, the aforementioned processing is repeatedly executed from step S11.

The processing in step S18 is described below in detail. The current command determination circuit 24, based on the torque command value τ*, determines the excitation current command value id*, increases the excitation current command value id* and outputs the increased excitation current command value id*. The current command determination circuit 24 determines the torque current command value iq* based on the torque command value τ* and outputs the torque current command value iq*. Processing following the above processing is similar to the processing in step S17 described above in detail. As a result, the controller 16 can control each of the switching elements 13 based on the target value of the output voltage of the power conversion circuit 11 that is based on the increased excitation current command value id* and the torque current command value iq*.

As described above, when the measurement value of the rotation speed of the electric motor 91 is equal to or lower than the first threshold rotation speed and the measurement value of the temperature of the air outside of the housing 31 is equal to or lower than the threshold temperature, the controller 16 included in the power conversion device 1 according to Embodiment 2 increases the excitation current command value id* and controls each of the switching elements 13 based on the target value of the output voltage of the power conversion circuit 11 that is based on the increased excitation current command value id* and the torque current command value iq*.

Since the torque current command value iq* remains and is used as determined based on the torque command value τ*, no change occurs in the operation of the electric motor 91. Increasing the excitation current command value id* leads to an increase in the switching loss of each of the switching elements 13 and therefore leads to an increase in the amount of the heat generation of each of the switching elements 13. The increase in the amount of the heat generation of each of the switching elements 13 suppresses occurrence of freezing of the refrigerant 33c when the measurement value of the temperature of the air outside of the housing 31 is equal to or lower than the threshold temperature. This configuration suppresses occurrence of a decrease in the performance of cooling the switching elements 13 due to interference with circulation of the refrigerant 33c resulting from the freezing of the refrigerant 33c and therefore improves the cooling performance of the power conversion device 1.

Even in the case in which the measurement value of the temperature of the air outside of the housing 31 is equal to or lower than the threshold temperature, when the measurement value of the rotation speed of the electric motor 91 is higher than the first threshold rotation speed, the controller 16 controls each of the switching elements 13 based on the excitation current command value id* and the torque current command value iq* that are determined based on the torque command value τ*. This configuration prevents the amount of the heat generation of each of the switching elements 13 from being increased more than is needed.

Embodiment 3

In Embodiments 1 and 2, in order to suppress occurrence of a decrease in the cooling performance of the power conversion device 1, the controllers 12 and 16 control the switching operations of the multiple switching elements 13 such that the amount of the heat generation of the multiple switching elements 13 is obtained that is based on the operational status of the load equipment and the temperature of the air. The method for suppressing occurrence of a decrease in the cooling performance is not limited to the aforementioned example, and a method may be used in which a flowrate of air around the at least one heat pipe 33 is adjusted.

Figure 11:
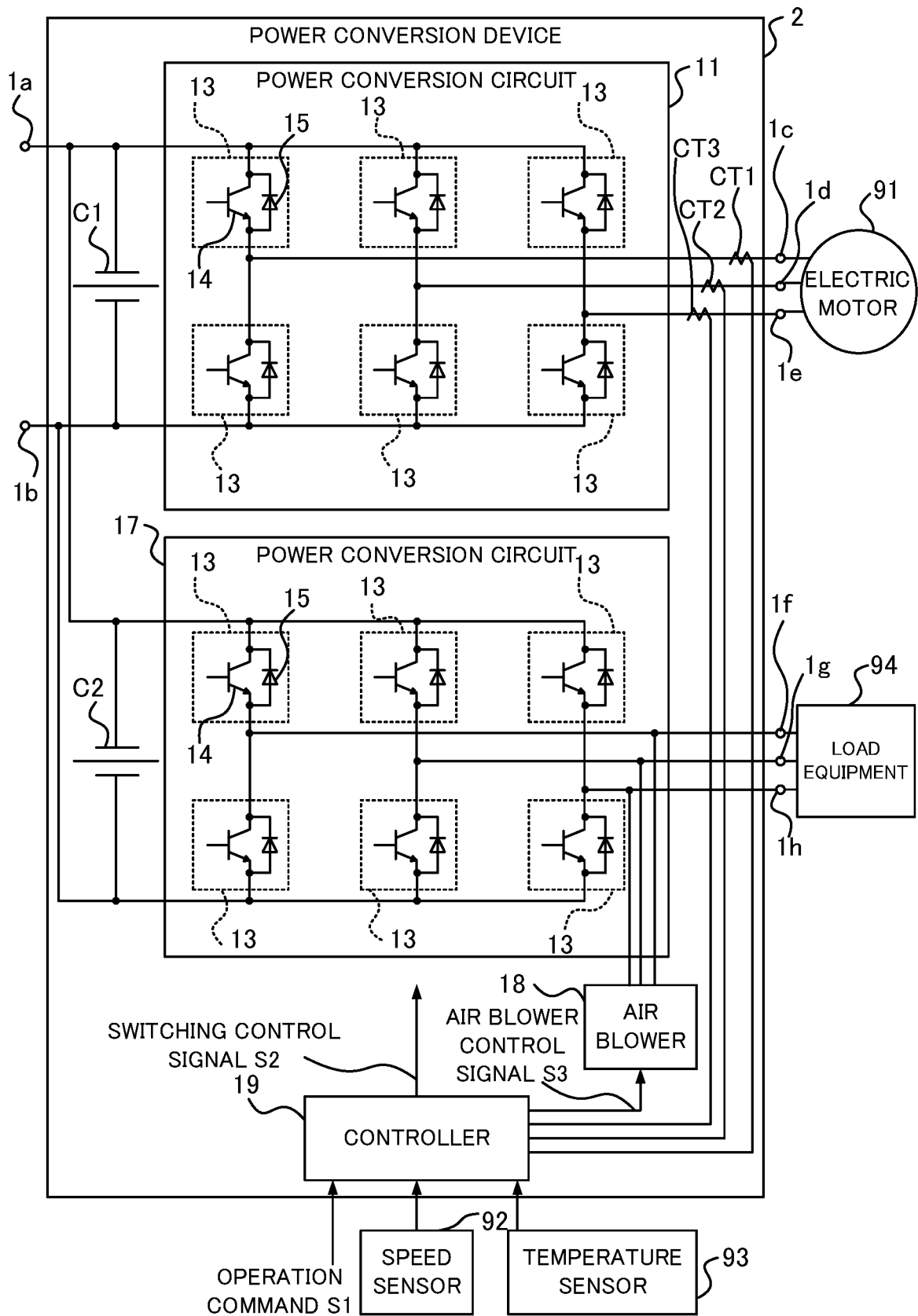
FIG. 11 is a circuit diagram of a power conversion device according to Embodiment 3.

A power conversion device 2 according to Embodiment 3 that is illustrated in FIG. 11 adjusts, with an air blower 18, the flowrate of air around the at least one heat pipe 33. In other words, although the power conversion devices 1 according to Embodiments 1 and 2 employ a naturally-cooled type system in which each of the switching elements 13 is cooled by the air flowing toward the rear part of the railway vehicle during travel of the railway vehicle, the power conversion device 2 according to Embodiment 3 employs a forced air cooling system including an air blower. The "flowrate of air" indicates an amount of air flowing per unit time.

Configuration of the power conversion device 2 is described below while focusing on differences from the power conversion device 1. The power conversion device 2 includes, in addition to the elements included in the power conversion device 1 according to Embodiment 1, output terminals 1f, 1g and 1h connected to the load equipment 94, and a power conversion circuit 17 that converts direct-current power supplied from the power source into three-phase alternating-current power to be supplied to the load equipment 94 and that supplies the three-phase alternating-current power to the load equipment 94. The power conversion device 2 further includes a capacitor C2 connected between a pair of primary terminals that is connected to the input terminals 1a and 1b of the power conversion circuit 17 and an air blower 18 that blows the air outside of the housing 31 to each heat pipe 33. The power conversion device 2 further includes a controller 19 that controls the power conversion circuits 11 and 17 and the air blower 18 such that the target voltage is outputted from the power conversion circuit 11 and an amount of air blowing of the air blower 18 is obtained that is based on the operational status of the load equipment and the temperature of the air.

The output terminals 1f, 1g and 1h are terminals that correspond respectively to a U-phase, a V-phase and a W-phase of the three-phase alternating-current power. The output terminals 1f, 1g and 1h are connected to the load equipment 94 that is, for example, an illumination device, an air conditioning device, or the like.

The power conversion circuit 17 has configuration similar to the configuration of the power conversion circuit 11. A connection point of two switching elements 13 of the power conversion circuit 17 corresponding to the U-phase is electrically connected to the output terminal 1f. A connection point of two switching elements 13 of the power conversion circuit 17 corresponding to the V-phase is electrically connected to the output terminal 1g. A connection point of two switching elements 13 of the power conversion circuit 17 corresponding to the W-phase is electrically connected to the output terminal 1h.

Figure 12:
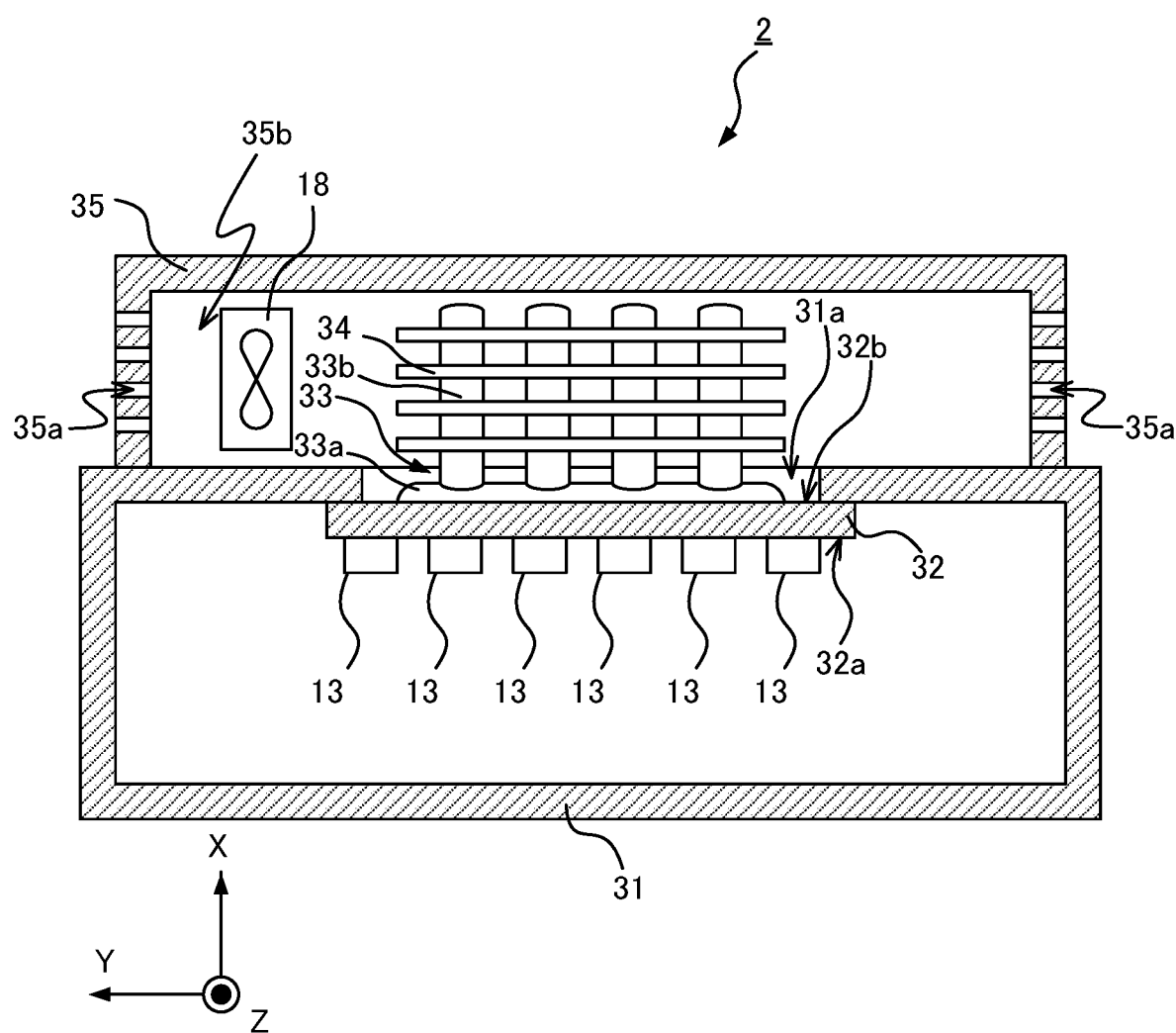
FIG. 12 is a cross-sectional view of the power conversion device according to Embodiment 3.

As illustrated in FIG. 12 that is a cross-sectional view of the power conversion device 2 taken similarly to FIG. 4, the multiple switching elements 13 included in the power conversion circuit 17 are attached to the first main surface 32a of the heat receiving block 32, similarly to the multiple switching elements 13 included in the power conversion circuit 11.

The air blower 18 illustrated in FIG. 11 includes a blower or a fan. The air blower 18 receives supply of the three-phase alternating-current power from the power conversion circuit 17 and operates under control that is based on an air blower control signal S3 outputted by the controller 19. As illustrated in FIG. 12, the air blower 18 is disposed in the duct 35b defined by the cover 35. During operation of the air blower 18, air flows in the duct 35b in, for example, a positive Y-axis direction.

Figure 13:
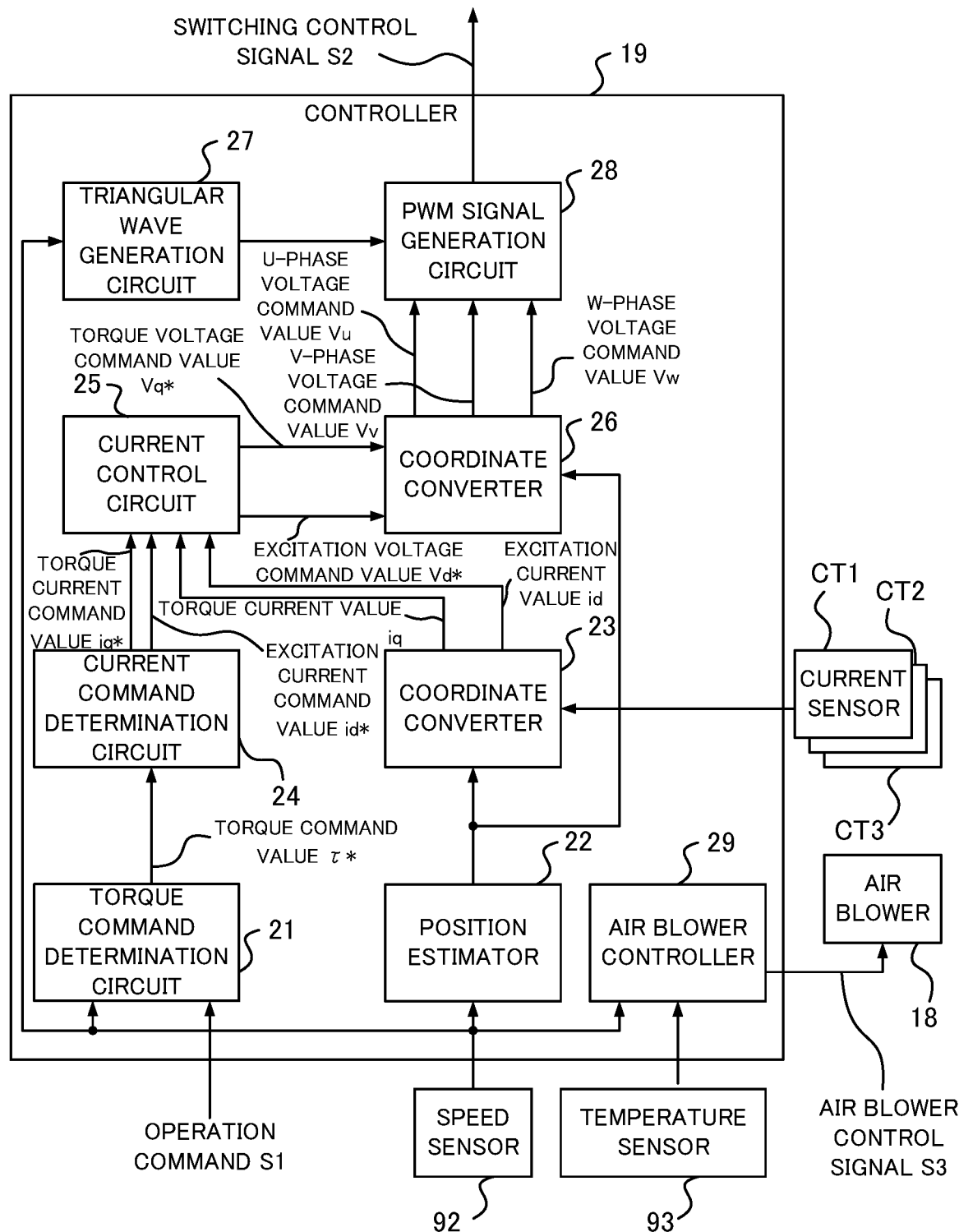
FIG. 13 is a block diagram of a controller according to Embodiment 3.

Although the controller 19 as illustrated in FIG. 13 is basically similar to the controller 12 illustrated in FIG. 5 in configuration and operation of each element, the controller 19 is different in configuration from the controller 12 in that an air blower controller 29 is included that controls the air blower 18. The triangular wave generation circuit 27 included in the controller 19 is different in operation from that of the controller 12.

The controller 19 controls the switching operations of the multiple switching elements 13 and the amount of the air blowing of the air blower 18 such that (i) a target voltage as a target value of an output voltage is outputted from the power conversion circuit 11 and (ii) an amount of the air blowing of the air blower 18 is obtained that is based on the measurement value of the rotation speed of the electric motor 91 that is the indicator of the operational status of the load equipment and the temperature of the air outside of the power conversion device 2.

When the measurement value of the rotation speed that is acquired from the speed sensor 92 is higher than the first threshold rotation speed, the triangular wave generation circuit 27 included in the controller 19 outputs a triangular wave of a frequency that is based on the rotation speed of the electric motor 91, similarly to Embodiment 2. When the measurement value of the rotation speed that is acquired from the speed sensor 92 is equal to or lower than the first threshold rotation speed, the triangular wave generation circuit 27 outputs a triangular wave having the frequency f1 that is independent of the rotation speed of the electric motor 91.

The air blower controller 29 generates, based on the measurement value of the rotation speed of the electric motor 91 that is acquired from the speed sensor 92 and the measurement value of the temperature of the air outside of the housing 31 that is acquired from the temperature sensor 93, an air blower control signal S3 providing instruction for the operation of the air blower 18. The air blower control signal S3 is, for example, a signal providing instruction of the amount of the air blowing of the air blower 18. In Embodiment 3, when the measurement value of the rotation speed of the electric motor 91 is equal to or lower than a second threshold rotation speed and the measurement value of the temperature of the air outside of the housing 31 is equal to or lower than the threshold temperature, the air blower controller 29 generates the air blower control signal S3 providing instruction to reduce the amount of the air blowing of the air blower 18. The second threshold rotation speed is determined based on a speed of the railway vehicle at which freezing of the refrigerant 33c may possibly occur due to cooling of each of the switching elements 13 by air blown by the air blower 18. For example, the second threshold rotation speed is set to a rotation speed of the electric motor 91 at which the railway vehicle travels at 5 kilometers per hour.

Figure 14:
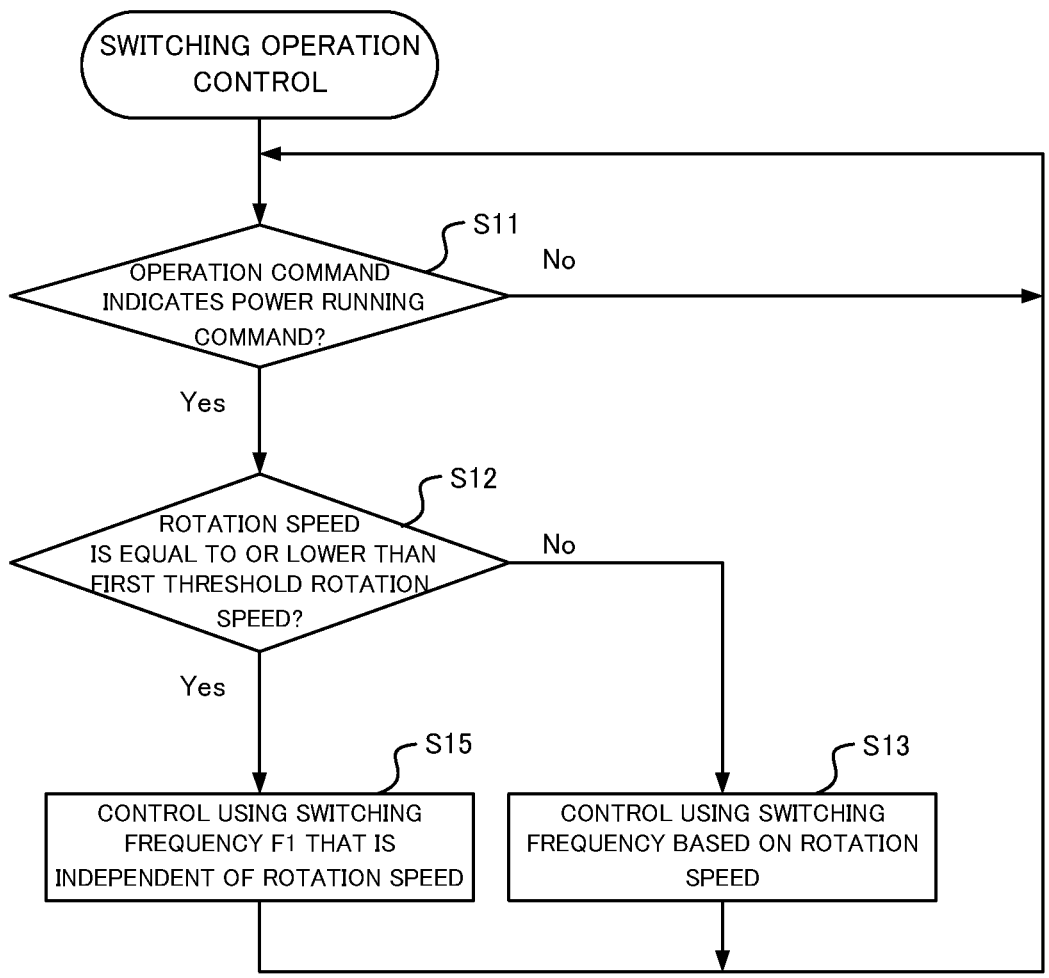
FIG. 14 is a flowchart of switching operation control processing executed by the controller according to Embodiment 3.

Processing for control of the switching operation of each of the switching elements 13 that is executed by the controller 19 having the aforementioned configuration is described with reference to FIG. 14. Processing in steps S11, S12, S13 and S15 of FIG. 14 is similar to that executed by the controller 12 of the power conversion device 1 according to Embodiment 1 that is illustrated in FIG. 7. When the operation command S1 indicates the power running command (YES in step S11) and the measurement value of the rotation speed of the electric motor 91 is higher than the first threshold rotation speed (NO in step S12), the controller 12 controls the switching elements 13 using a switching frequency that is based on the rotation speed of the electric motor 91 (step S13). When the operation command S1 indicates the power running command (YES in step S11) and the measurement value of the rotation speed of the electric motor 91 is equal to or lower than the first threshold rotation speed (YES in step S12), the controller 12 controls the switching elements 13 using the switching frequency f1 that is independent of the rotation speed of the electric motor 91 (step S15). After the processing in step S13 or in step S15, the aforementioned processing is repeatedly executed from step S11.

Figure 15:
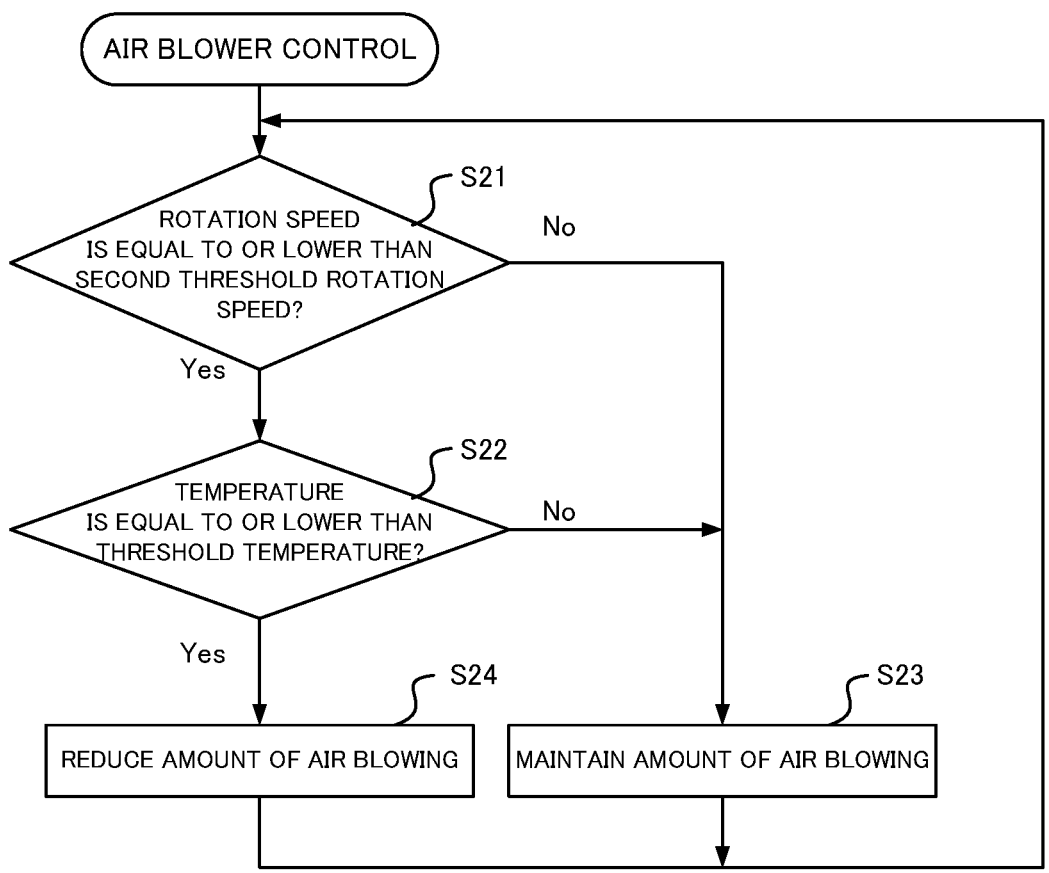
FIG. 15 is a flowchart of air blower control processing executed by the controller according to Embodiment 3.

Operation for control of the air blower 18 performed by the controller 19 is described with reference to FIG. 15. In response to the measurement value of the rotation speed acquired from the speed sensor 92 being higher than zero, in other words, upon the electric motor 91 being driven, the controller 19 starts the operation illustrated in FIG. 15. When the measurement value of the rotation speed of the electric motor 91 is higher than the second threshold rotation speed (NO in step S21), or when the measurement value of the rotation speed of the electric motor 91 is equal to or lower than the second threshold rotation speed (YES in step S21) and the measurement value of the temperature of the air outside of the housing 31 that is acquired from the temperature sensor 93 is higher than the threshold temperature (NO in step S22), the processing in step S23 is executed. Specifically, the controller 19 generates and outputs the air blower control signal S3 providing instruction to perform operation with the amount of the air blowing of the air blower 18 being maintained as is, and causes the air blower 18 to operate while maintaining the amount of the air blowing (step S23). Thereafter, the aforementioned processing is repeatedly executed from step S21.

When the measurement value of the rotation speed of the electric motor 91 is equal to or lower than the second threshold rotation speed (YES in step S21) and the measurement value of the temperature of the air outside of the housing 31 that is acquired from the temperature sensor 93 is equal to or lower than the threshold temperature (YES in step S22), the processing in step S24 is executed. Specifically, the controller 19 generates and outputs the air blower control signal S3 providing instruction to reduce the amount of the air blowing of the air blower 18, and reduces the amount of the air blowing of the air blower 18 (step S24). For example, the controller 19 generates, in step S24, the air blower control signal S3 providing instruction to stop the air blower 18. Thereafter, the aforementioned processing is repeatedly executed from step S21.

As described above, when the measurement value of the rotation speed of the electric motor 91 is equal to or lower than the second threshold rotation speed and the measurement value of the temperature of the air outside of the housing 31 is equal to or lower than the threshold temperature, the controller 19 included in the power conversion device 2 according to Embodiment 3, in order to suppress occurrence of excessive cooling of the heat pipe 33, reduces the amount of the air blowing of the air blower 18 to be lower than those in the case in which the measurement value of the rotation speed of the electric motor 91 is higher than the second threshold rotation speed and in the case in which the measurement value of the temperature of the air outside of the housing 31 is higher than the threshold temperature. This suppresses freezing of the refrigerant 33c when the measurement value of the temperature of the air outside of the housing 31 is equal to or lower than the threshold temperature. This configuration suppresses occurrence of a decrease in the performance of cooling the switching elements 13 due to interference with circulation of the refrigerant 33c resulting from the freezing of the refrigerant 33c and therefore improves the cooling performance of the power conversion device 2.

Even in the case in which the measurement value of the temperature of the air outside of the housing 31 is equal to or lower than the threshold temperature, when the measurement value of the rotation speed of the electric motor 91 is higher than the second threshold rotation speed, the controller 19 causes the air blower 18 to operate. Due to this configuration, each of the switching elements 13 is sufficiently cooled when the measurement value of the rotation speed of the electric motor 91 is higher than the second threshold rotation speed and the amount of the heat generation of each of the switching elements 13 is high. For example, even in the case in which the measurement value of the temperature of the air outside of the housing 31 is equal to or lower then the threshold temperature, upon the measurement value of the rotation speed of the electric motor 91 reaching the second threshold rotation speed during acceleration of the railway vehicle in which the power conversion device 2 is installed, the air blower 18 continues to operate without a reduction in the amount of the air blowing. This configuration enables sufficiently cooling each of the switching elements 13 even upon an increase in the amount of the heat generation of each of the switching elements 13 during acceleration of the railway vehicle.

Embodiment 4

The method for increasing the amount of the heat generation of the multiple switching elements 13 is not limited to the methods in Embodiments 1 and 2. Specifically, the parameter that contributes to increase and decrease in the amount of the heat generation of each of the switching elements 13 is not limited to the parameter of the aforementioned switching operation. One example of the parameter that contributes to increase and decrease in the amount of the heat generation of each of the switching elements 13 is a value of resistance connected to the gate terminal of each of the switching elements 13. In Embodiment 4, a power conversion device in which the amount of the heat generation of the multiple switching element 13 is increased by increasing the value of the resistance connected to the gate terminal of each of the switching elements 13 is described while focusing on differences from the power conversion device 1 according to Embodiment 1.

Figure 16:
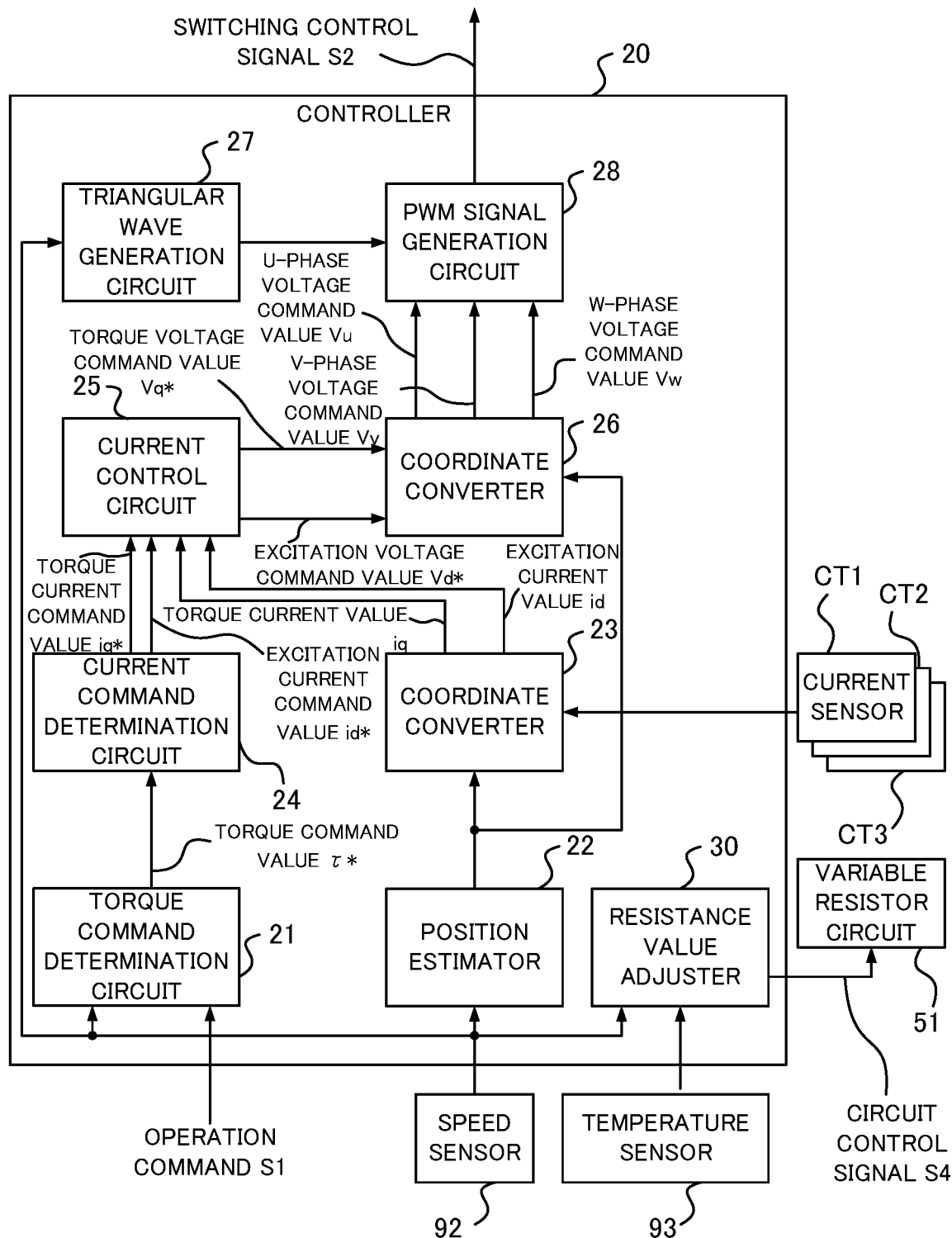
FIG. 16 is a block diagram of a controller according to Embodiment 4.

A power conversion device 1 according to Embodiment 4 has configuration that is basically similar to the configuration of the power conversion device 1 according to Embodiment 1 but is different from the power conversion device 1 according to Embodiment 1 in that a controller 20 is included as illustrated in FIG. 16. The controller 20 adjusts the value of the resistance connected to the gate terminal of each of the switching elements 13 such that an amount of the heat generation of the multiple switching elements 13 is obtained that is based on the measurement value of the rotation speed of the electric motor 91 and the temperature of the air outside of the power conversion device 1.

Although the controller 20 as illustrated in FIG. 16 is basically similar to the controller 12 illustrated in FIG. 5 in configuration and operation of each element, the controller 20 is different in configuration from the controller 12 in that a resistance value adjuster 30 is included that adjusts a resistance value of a variable resistor circuit 51 that is electrically connected to each of the switching elements 13. The triangular wave generation circuit 27 included in the controller 20 is different in operation from that of the controller 12.

Similarly to Embodiment 2, when the measurement value of the rotation speed that is acquired from the speed sensor 92 is higher than the first threshold rotation speed, the triangular wave generation circuit 27 outputs a triangular wave of a frequency that is based on the rotation speed of the electric motor 91. When the measurement value of the rotation speed that is acquired from the speed sensor 92 is equal to or lower than the first threshold rotation speed, the triangular wave generation circuit 27 outputs a triangular wave having the frequency f1 that is independent of the rotation speed of the electric motor 91.

The resistance value adjuster 30 generates, based on the measurement value of the rotation speed of the electric motor 91 that is acquired from the speed sensor 92 and the measurement value of the temperature of the air outside of the housing 31 that is acquired from the temperature sensor 93, a circuit control signal S4 for adjusting the resistance value of the variable resistor circuit 51. In Embodiment 4, when the measurement value of the rotation speed of the electric motor 91 is equal to or lower than the first threshold rotation speed and the measurement value of the temperature of the air outside of the housing 31 is equal to or lower than the threshold temperature, the resistance value adjuster 30 generates the circuit control signal S4 for increasing the resistance value of the variable resistor circuit 51.

Figure 17:
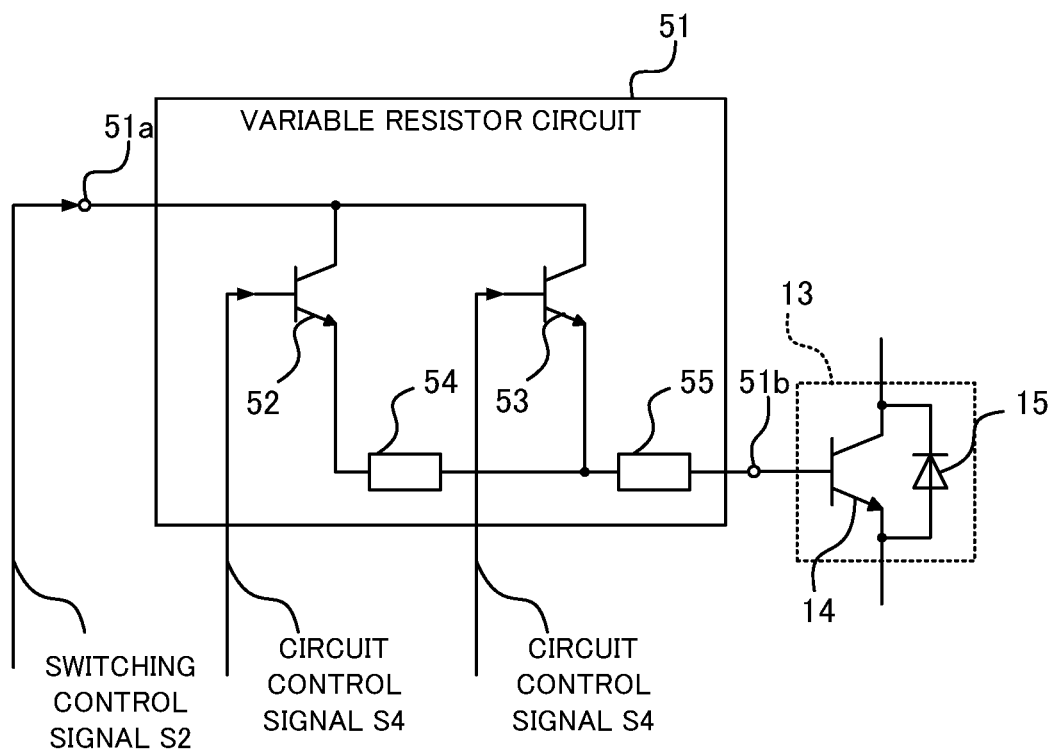
FIG. 17 is a circuit diagram of a variable resistor circuit according to Embodiment 4.

The variable resistor circuit 51 illustrated in FIG. 17 is electrically connected to the gate terminal of the IGBT 14 of each of the switching elements 13. Specifically, the variable resistor circuit 51 includes an input terminal 51a to which the switching control signals S2 outputted by the controller 20 are supplied and an output terminal 51b connected to the gate terminals of the IGBTs 14. The variable resistor circuit 51 further includes switching elements 52 and 53 each having one end connected to the input terminal 51a, a resistor 54 connected between the switching elements 52 and 53, and a resistor 55 connected between the resistor 54 and the output terminal 51b.

Each of the switching elements 52 and 53 includes, for example, an IGBT. Collector terminals of the switching elements 52 and 53 are connected to the input terminal 51a. The circuit control signal S4 outputted by the controller 20 is supplied to gate terminals of the switching elements 52 and 53.

Control of the switching operation of each of the switching elements 13 that is executed by the controller 20 having the aforementioned configuration is similar to the processing illustrated in FIG. 14.

Processing for adjusting the resistance value of the variable resistor circuit 51 that is executed by the controller 20 having the aforementioned configuration is described with reference to FIG. 18. The controller 20 outputs, upon start of supply of electric power from a non-illustrated power source for the controller 20, the circuit control signal S4 for causing the switching element 53 to be in an on-state and causing the switching element 52 to be in an off-state. In this state, the resistance value of the variable resistor circuit 51 is deemed as a resistance value of the resistor 55. The resistance value of the variable resistor circuit 51 in this case is taken to be an initial value.

Figure 18:
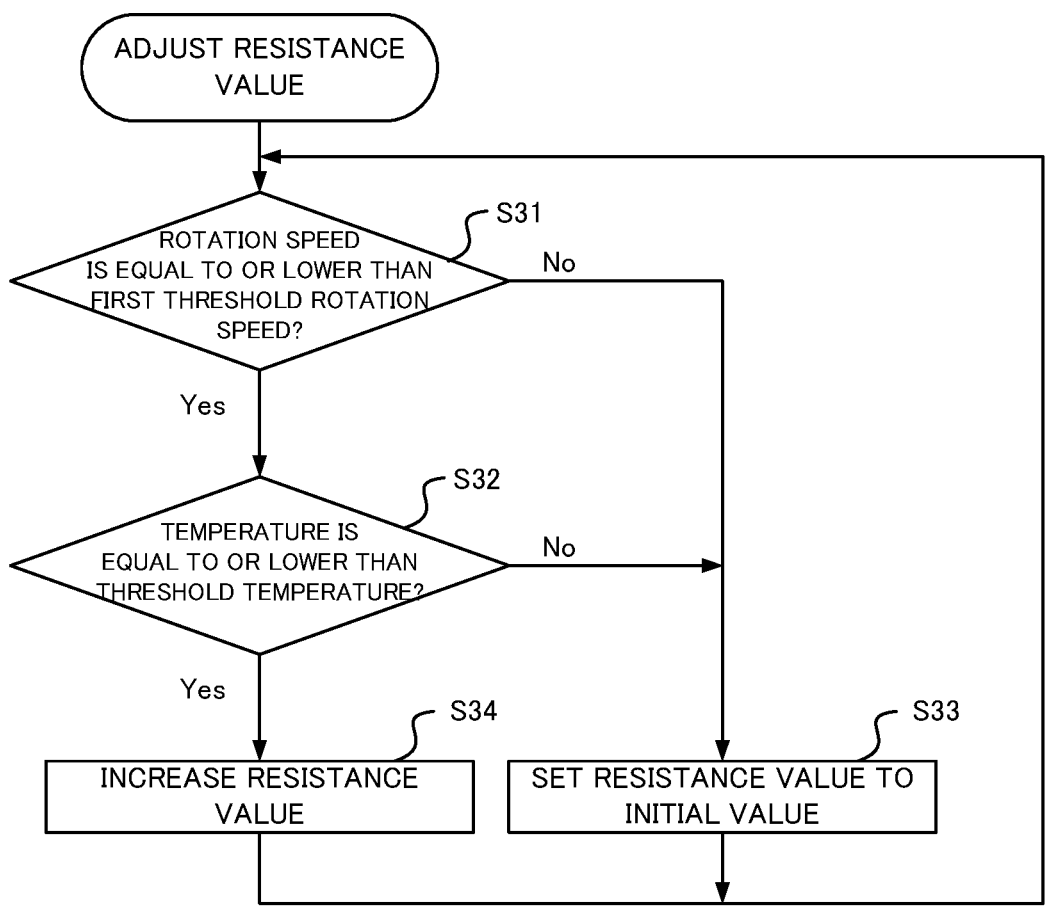
FIG. 18 is a flowchart of resistance value adjustment processing executed by the controller according to Embodiment 4.

Thereafter, in response to the measurement value of the rotation speed acquired from the speed sensor 92 being higher than zero, in other words, upon the electric motor 91 being driven, the controller 20 starts the operation illustrated in FIG. 18. When the measurement value of the rotation speed of the electric motor 91 is higher than the first threshold rotation speed (NO in step S31), or when the measurement value of the rotation speed of the electric motor 91 is equal to or lower than the first threshold rotation speed (YES in step S31) and the measurement value of the temperature of the air outside of the housing 31 that is acquired from the temperature sensor 93 is higher than the threshold temperature (NO in step S32), the processing in step S33 is executed. Specifically, the controller 20 sets the resistance value of the variable resistor circuit 51 to the initial value (step S33). Thereafter, the aforementioned processing is repeatedly executed from step S31.

The processing in step S33 is described below in detail. The controller 20 outputs the circuit control signal S4 for causing the switching element 53 to be in the on-state and causing the switching element 52 to be in the off-state. This leads to maintaining the resistance value of the variable resistor circuit 51 at the initial value.

When the measurement value of the rotation speed of the electric motor 91 is equal to or lower than the first threshold rotation speed (YES in step S31) and the measurement value of the temperature of the air outside of the housing 31 that is acquired from the temperature sensor 93 is equal to or lower than the threshold temperature (YES in step S32), the controller 20 increases the resistance value of the variable resistor circuit 51 (step S34). Thereafter, the aforementioned processing is repeatedly executed from step S31.

The processing in step S34 is described below in detail. The controller 20 outputs the circuit control signal S4 for causing the switching element 52 to be in the on-state and causing the switching element 53 to be in the off-state. In this state, the resistance value of the variable resistor circuit 51 is deemed as a value of combined resistance of the resistors 54 and 55 that are series-connected. This leads to an increase in the resistance value of the variable resistor circuit 51.

As described above, the controller 20 included in the power conversion device 1 according to Embodiment 4 increases the resistance value of the variable resistor circuit 51 when the measurement value of the rotation speed of the electric motor 91 is equal to or lower than the first threshold rotation speed and the measurement value of the temperature of the air outside of the housing 31 is equal to or lower than the threshold temperature. The increase in the resistance value of the variable resistor circuit 51 connected to the gate terminal of each of the switching elements 13 causes an increase in the amount of the heat generation of each of the switching elements 13. The increase in the amount of the heat generation of each of the switching elements 13 suppresses freezing of the refrigerant 33c when the measurement value of the temperature of the air outside of the housing 31 is equal to or lower than the threshold temperature. This configuration suppresses occurrence of a decrease in the performance of cooling the switching elements 13 due to interference with circulation of the refrigerant 33c resulting from the freezing of the refrigerant 33c and therefore improves the cooling performance of the power conversion device 1.

Even in the case in which the measurement value of the temperature of the air outside of the housing 31 is equal to or lower than the threshold temperature, when the measurement value of the rotation speed of the electric motor 91 is higher than the first threshold rotation speed, the controller 20 maintains the resistance value of the variable resistor circuit 51 at the initial value. This configuration prevents the amount of the heat generation of each of the switching elements 13 from being increased more than is needed.

Figure 19:
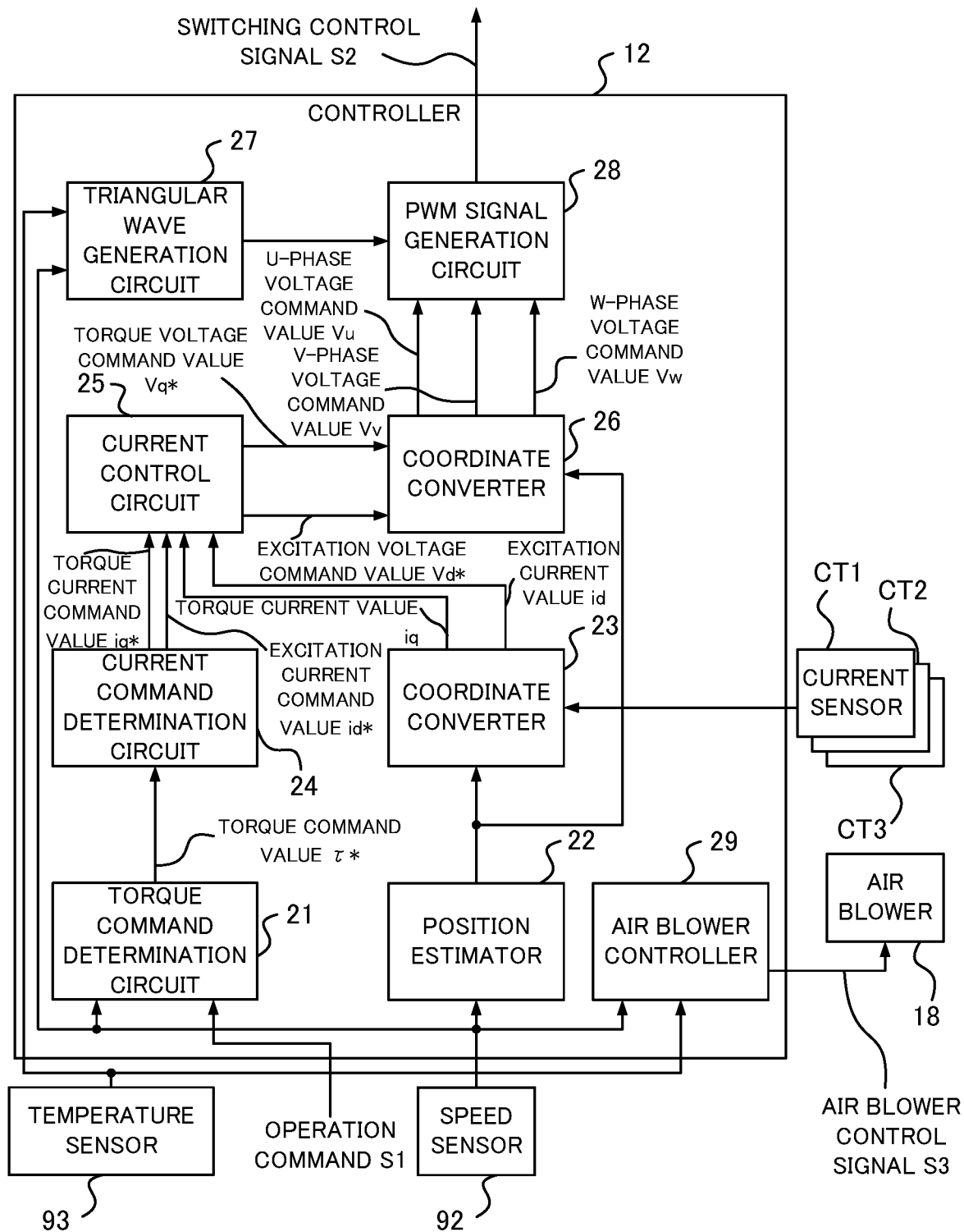
FIG. 19 is a block diagram of a first modified example of the controller according to the embodiments.

The present disclosure is not limited to the aforementioned embodiments. Any of the aforementioned embodiments may be freely combined. For example, as illustrated in FIG. 19, the power conversion device 1 may further include the air blower 18 and the controller 12 may further include the air blower controller 29 that is included in the controller 19 included in the power conversion device 2 according to Embodiment 3. An operation of the controller 12 illustrated in FIG. 19 is described below using an example case in which the first threshold rotation speed is set to a value higher than the second threshold rotation speed. When the measurement value of the rotation speed of the electric motor 91 is higher than the first threshold rotation speed, the controller 12 illustrated in FIG. 19 controls each of the switching elements 13 using a switching frequency that is based on the rotation speed, and causes the air blower 18 to operate.

When the measurement value of the rotation speed of the electric motor 91 is equal to or lower than the first threshold rotation speed and the measurement value of the temperature of the air outside of the housing 31 that is acquired from the temperature sensor 93 is higher than the threshold temperature, the controller 12 illustrated in FIG. 19 controls the switching elements 13 using the switching frequency f1 that is independent of the rotation speed of the electric motor 91, and causes the air blower 18 to operate.

When the measurement value of the rotation speed of the electric motor 91 is equal to or lower than the first threshold rotation speed and is higher than the second threshold rotation speed and the measurement value of the temperature of the air outside of the housing 31 that is acquired from the temperature sensor 93 is equal to or lower than the threshold temperature, the controller 12 illustrated in FIG. 19 controls the switching elements 13 using the switching frequency f2 that is higher than the switching frequency f1 and that is independent of the rotation speed of the electric motor 91, and causes the air blower 18 to operate.

When the measurement value of the rotation speed of the electric motor 91 is equal to or lower than the second threshold rotation speed and the measurement value of the temperature of the air outside of the housing 31 that is acquired from the temperature sensor 93 is equal to or lower than the threshold temperature, the controller 12 illustrated in FIG. 19 controls the switching elements 13 using the switching frequency f2 that is higher than the switching frequency f1 and that is independent of the rotation speed of the electric motor 91, and causes the air blower 18 to stop.

Figure 20:
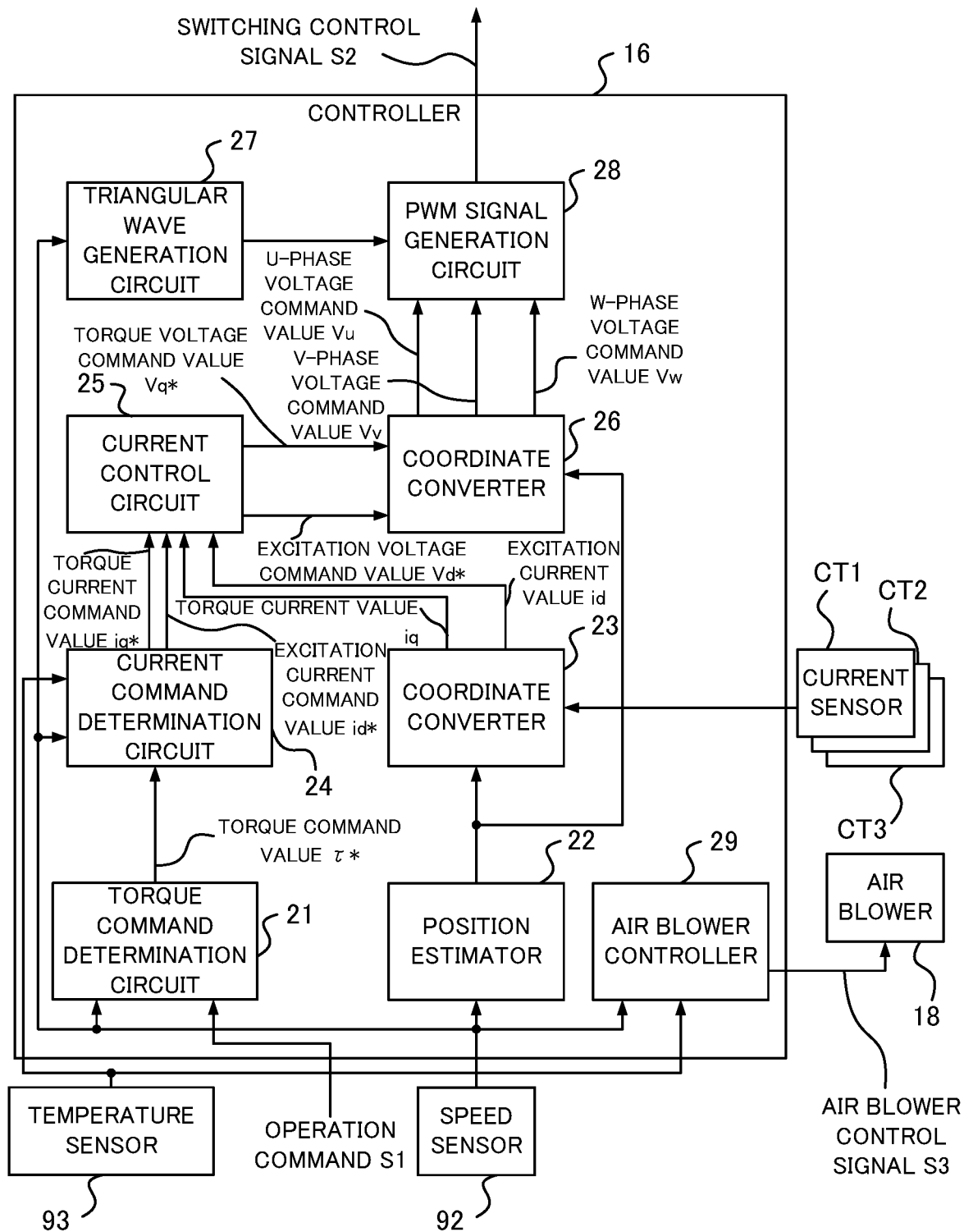
FIG. 20 is a block diagram of a second modified example of the controller according to the embodiments.

As another example, as illustrated in FIG. 20, the controller 16 may include the air blower controller 29 that is included in the controller 19 included in the power conversion device 2 according to Embodiment 3. Operation of the controller 16 illustrated in FIG. 20 is described below using an example case in which the first threshold rotation speed is set to a value higher than the second threshold rotation speed. When the measurement value of the rotation speed of the electric motor 91 is higher than the first threshold rotation speed, or when the measurement value of the rotation speed of the electric motor 91 is equal to or lower than the first threshold rotation speed and the measurement value of the temperature of the air outside of the housing 31 that is acquired from the temperature sensor 93 is higher than the threshold temperature, the controller 16 illustrated in FIG. 20 controls each of the switching elements 13 based on the target value of the output voltage of the power conversion circuit 11 that is based on the excitation current command value id* and the torque current command value iq* that are determined based on the torque command value τ*, and causes the air blower 18 to operate.

When the measurement value of the rotation speed of the electric motor 91 is equal to or lower than the first threshold rotation speed and is higher than the second threshold rotation speed and the measurement value of the temperature of the air outside of the housing 31 that is acquired from the temperature sensor 93 is equal to or lower than the threshold temperature, the controller 16 illustrated in FIG. 20 increases the excitation current command value id* determined based on the torque command value τ* and controls each of the switching elements 13 based on the target value of the output voltage of the power conversion circuit 11 that is based on the increased excitation current command value id* and the torque current command value iq*, and causes the air blower 18 to operate.

When the measurement value of the rotation speed of the electric motor 91 is equal to or lower than the second threshold rotation speed and the measurement value of the temperature of the air outside of the housing 31 that is acquired from the temperature sensor 93 is equal to or lower than the threshold temperature, the controller 16 illustrated in FIG. 20 increases the excitation current command value id* determined based on the torque command value τ* and controls each of the switching elements 13 based on the target value of the output voltage of the power conversion circuit 11 that is based on the increased excitation current command value id* and the torque current command value iq*, and causes the air blower 18 to stop.

The power conversion devices 1 and 2 may control the switching operations of the multiple switching elements 13 such that an amount of the heat generation of the multiple switching elements 13 is obtained that is based on the operational status of the load equipment, the temperature of the air, and a temperature of the multiple switching elements 13. The power conversion device 1 illustrated in FIG. 21 includes, in addition to the elements of the power conversion device 1 illustrated in FIG. 2, a temperature sensor 95 attached to the heat receiving block 32. The temperature sensor 95 is preferably disposed at a position adjacent to at least one of the multiple switching elements 13, to measure a temperature of surrounding air. Due to this configuration, a measurement value of the temperature sensor 95 can be deemed as a measurement value of the temperature of the switching elements 13.

Figure 21:
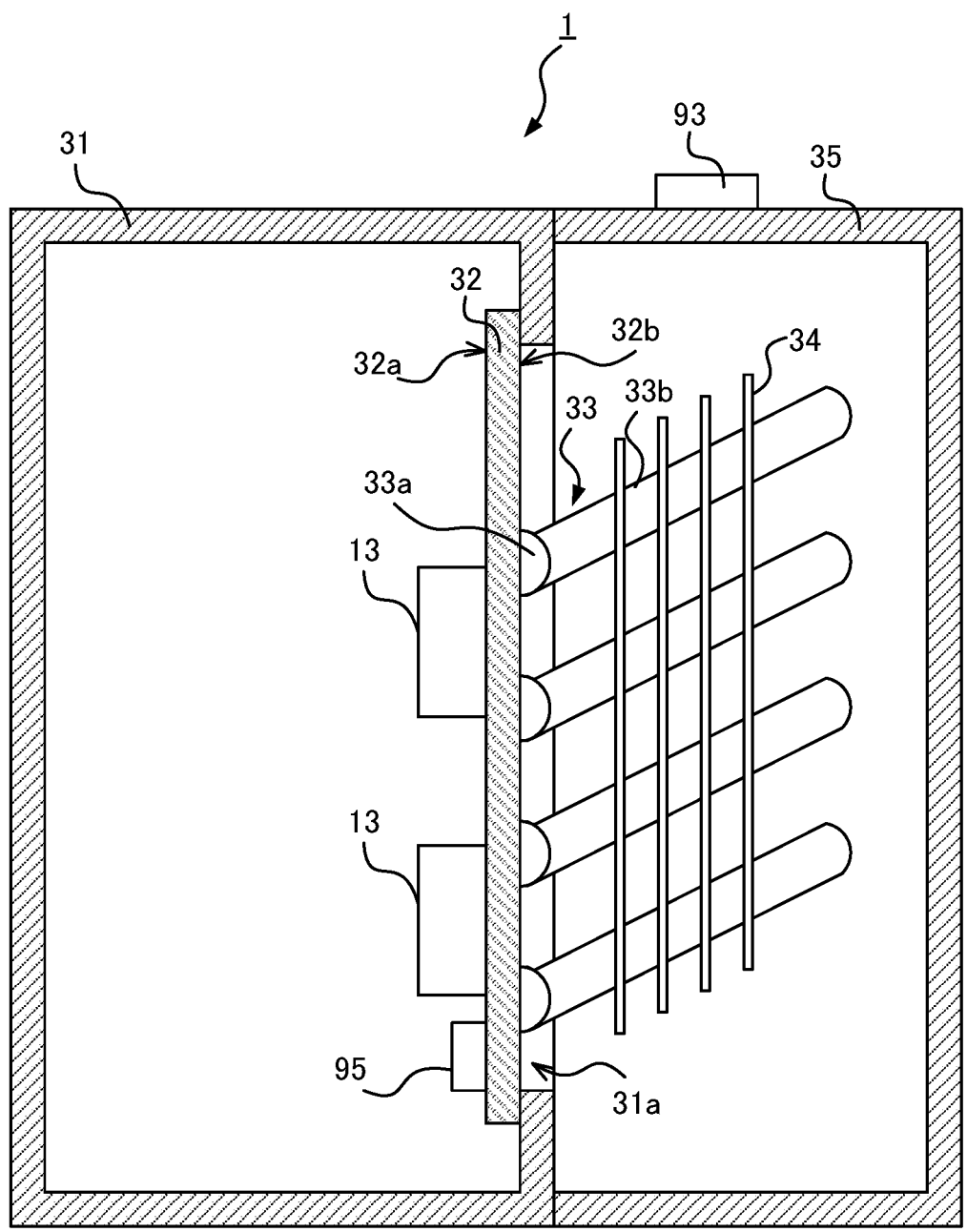
FIG. 21 is a cross-sectional view of a modified example of the power conversion device according to the embodiments.
Figure 22:
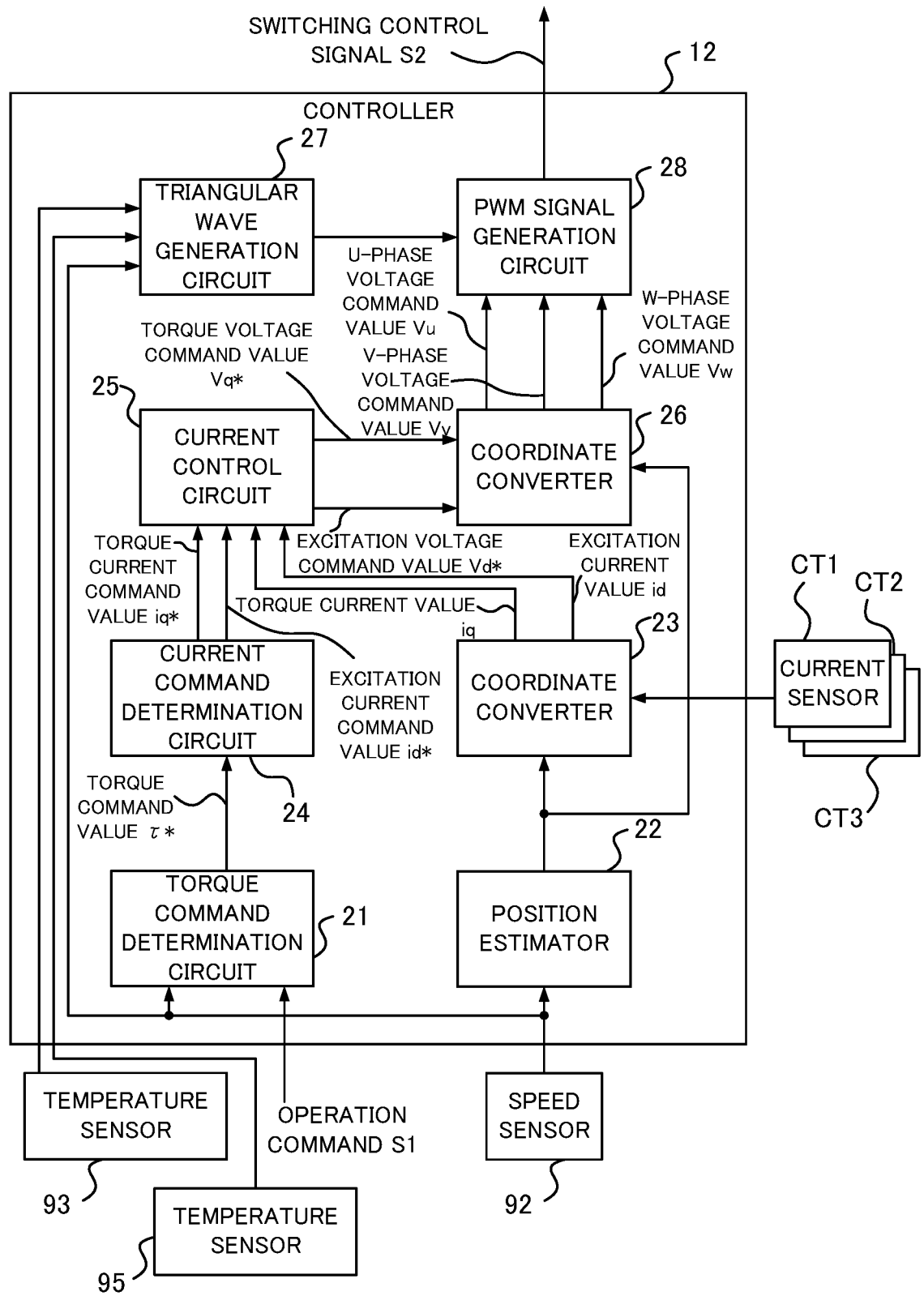
FIG. 22 is a block diagram of a third modified example of the controller according to the embodiments.

FIG. 22 illustrates details of the controller 12 included in the power conversion device 1 illustrated in FIG. 21. Although the controller 12 illustrated in FIG. 22 is basically similar to the controller 12 that is illustrated in FIG. 5 and that is included in the power conversion device 1 according to Embodiment 1 in configuration and operation of each element, the triangular wave generation circuit 27 is different from that of Embodiment 1.

Figure 23:
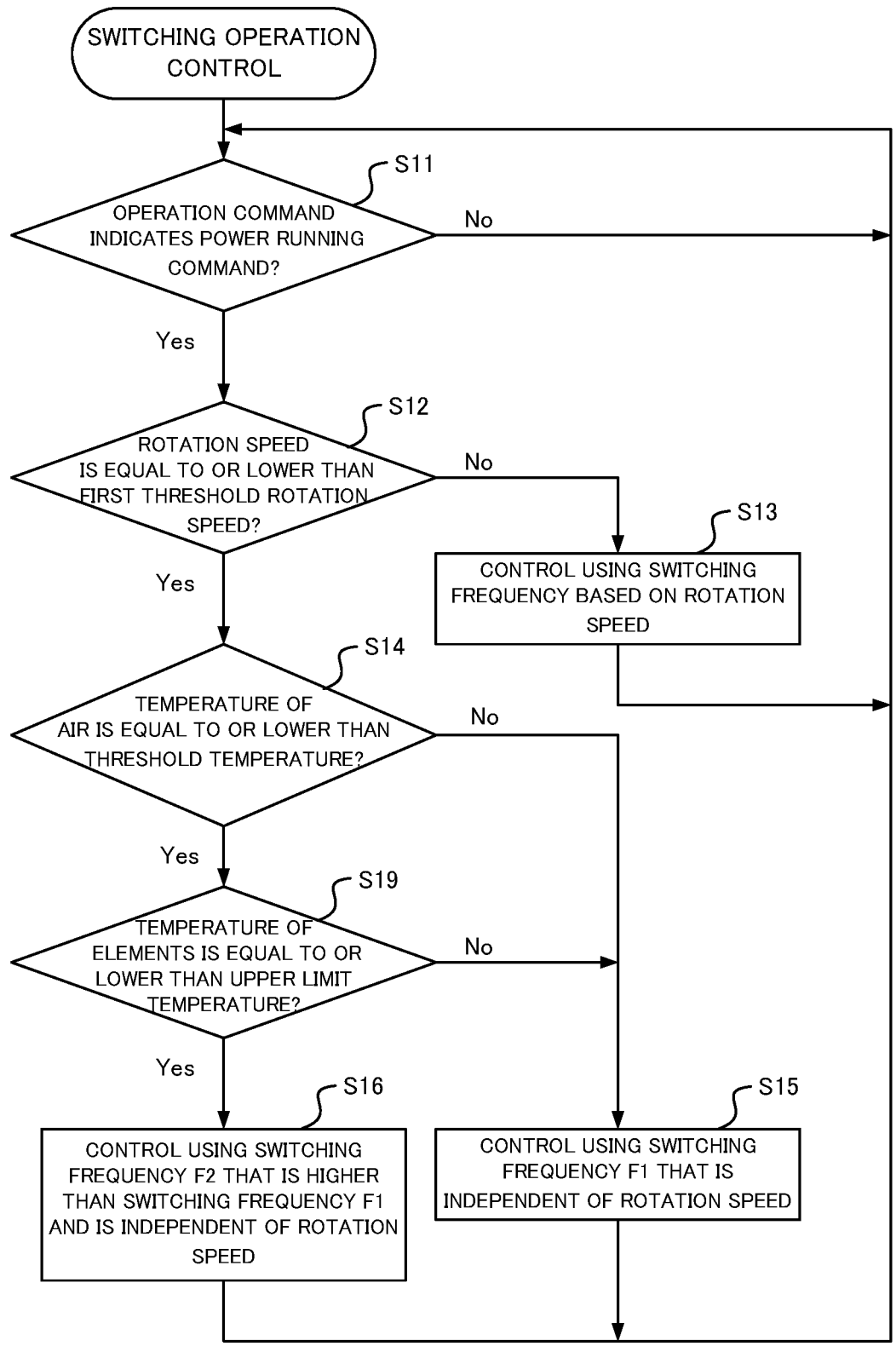
FIG. 23 is a flowchart of switching operation control processing executed by a third modified example of the controller according to the embodiments.

Operation of the controller 12 illustrated in FIG. 22 is described with reference to FIG. 23. Processing from step S11 to S14 is similar to the processing illustrated in FIG. 7 that is executed by the controller 12 included in the power conversion device 1 according to Embodiment 1. When the operation command S1 indicates the power running command (YES in step S11), the measurement value of the rotation speed of the electric motor 91 is equal to or lower than the first threshold rotation speed (YES in step S12), the measurement value of the temperature of the air outside of the housing 31 that is acquired from the temperature sensor 93 is equal to or lower than the threshold temperature (YES in step S14), and the measurement value of the temperature of the switching elements that is acquired from the temperature sensor 95 is higher than an upper limit temperature (NO in step S19), the processing in step S15 is executed. Specifically, the controller 12 controls the switching elements 13 using the switching frequency f1 that is independent of the rotation speed of the electric motor 91 (step S15). Thereafter, the aforementioned processing is repeatedly executed from step S11.

When the operation command S1 indicates the power running command (YES in step S11), the measurement value of the rotation speed of the electric motor 91 is equal to or lower than the first threshold rotation speed (YES in step S12), the measurement value of the temperature of the air outside of the housing 31 that is acquired from the temperature sensor 93 is equal to or lower than the threshold temperature (YES in step S14), and the measurement value of the temperature of the switching elements 13 that is acquired from the temperature sensor 95 is equal to or lower than the upper limit temperature (YES in step S19), the processing in step S16 is executed. Specifically, the controller 12 controls the switching elements 13 using the switching frequency f2 that is higher than the switching frequency f1 and that is independent of the rotation speed of the electric motor 91 (step S16). Thereafter, the aforementioned processing is repeatedly executed from step S11.

The upper limit temperature is preferably set to a value within a temperature range indicating temperatures capable of being withstood by the switching elements 13. According to the operation of the controller 12 as illustrated in FIG. 23, in the case in which the temperature of the switching elements 13 is high, the processing for increasing the amount of the heat generation of the switching elements 13 is not executed. This configuration improves the cooling performance of the power conversion device 1.

The aforementioned hardware configuration and flowcharts are merely examples, and may be changed and modified freely.

Figure 24:
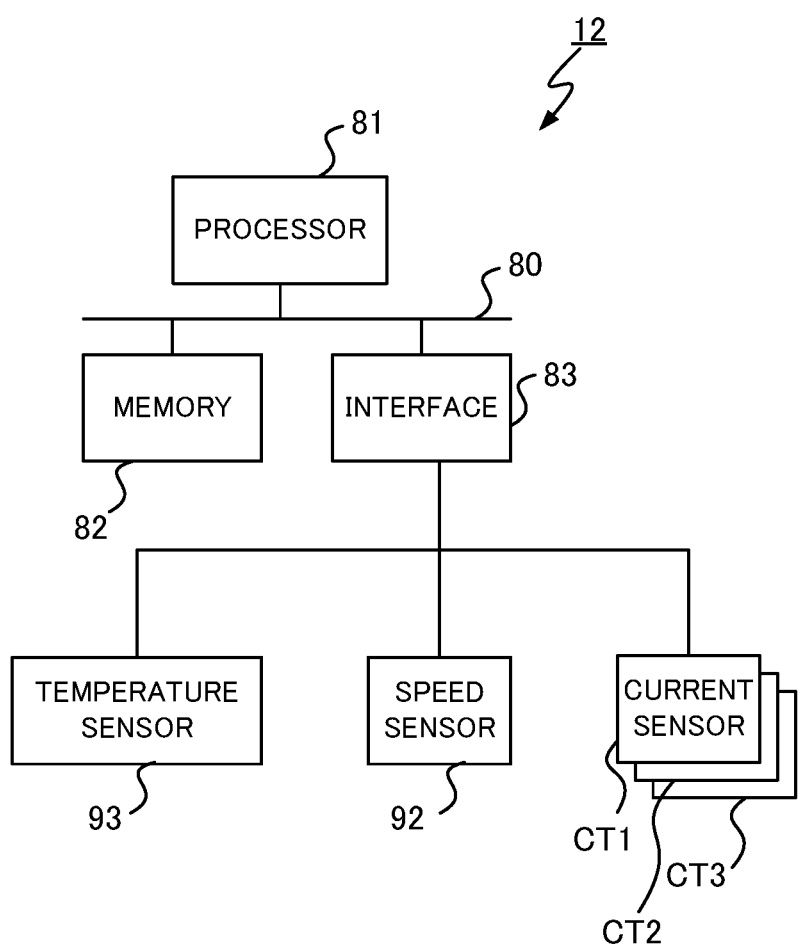
FIG. 24 is a block diagram illustrating a modified example of the hardware configuration of the controller according to the embodiments.

The functions of the controllers 12, 16, 19 and 20 may be achieved by software. FIG. 24 illustrates an example hardware configuration of the controller 12 in the case of achieving the functions of the controller 12 by software. The controller 12 includes a processor 81, a memory 82 and an interface 83. The processor 81, the memory 82 and the interface 83 are connected to one another via a bus 80.

Each of the functions of the controller 12 is achieved by software, firmware, or a combination of the software and the firmware. The software and the firmware are described as programs and stored in the memory 82. The processor 81 reads out the programs stored in the memory 82 to achieve the function of each of the aforementioned elements. That is, the memory 82 stores programs for execution of the processing by the controller 12.

The memory 82 includes, for example, a nonvolatile or volatile semiconductor memory such as a random access memory (RAM), a read only memory (ROM), a flash memory, an erasable programmable read only memory (EPROM), an electrically erasable and programmable read-only memory (EEPROM), a magnetic disc, a flexible disc, an optical disc, a compact disc, a mini disc, a digital versatile disc (DVD), or the like.

Configuration may be employed in which a part of the functions of the controller 12 is achieved by dedicated hardware and the other part is achieved by software or firmware. For example, the torque command determination circuit 21, the current command determination circuit 24, the current control circuit 25, the triangular wave generation circuit 27 and the PWM signal generation circuit 28 may be achieved by the processing circuit 71 illustrated in FIG. 6 and the position estimator 22 and the coordinate converters 23 and 26 may be achieved by the processor 81 illustrated in FIG. 23 by reading out and executing the programs stored in the memory 82.

Similarly to above, the controller 12 may adjust the amount of the heat generation of each of the switching elements 13 in the case in which the operation command S1 indicates the brake command or a coasting command. For example, similarly to above, the controller 12 may adjust the amount of the heat generation of each of the switching elements 13 in the case of regenerative braking. During regenerative braking, the controller 12 controls the switching operation of each of the switching elements 13 included in the power conversion circuit 11 in order to set a voltage of the capacitor C1 to a value that is higher than a voltage of the power supply line and that is within a range of voltages at which regeneration operation can be performed. This configuration allows the power conversion circuit 11 to convert, into direct-current power, three-phase alternating-current power supplied from the electric motor 91 operating as a power generator.

During regenerative braking, similarly to Embodiment 1, when the measurement value of the rotation speed of the electric motor 91 is equal to or lower than the first threshold rotation speed and the measurement value of the temperature of the air outside of the housing 31 that is acquired from the temperature sensor 93 is equal to or lower than the threshold temperature, the controller 12 may control each of the switching elements 13 based on the switching frequency f2 that is higher than the switching frequency f1 and that is independent of the rotation speed of the electric motor 91.

The first threshold rotation speed used for the determination by the controllers 12, 16, 19 and 20 is not limited to the aforementioned example and is determined based on a speed of the railway vehicle at which controlling the switching elements 13 in the asynchronous mode is preferable.

The threshold temperature used for the determination by the controllers 12, 16, 19 and 20 is not limited to 0 degrees Celsius and may be determined based on a characteristic of the refrigerant 33c.

Disposal of only two of the current sensors CT1, CT2 and CT3 is permissible. In other words, the controller 12 may acquire measurement values of phase currents of any two of the U-phase current, V-phase current and W-phase current and estimate, from the acquired measurement values of the two phase currents, a value of one phase current other than the two phase currents.

The temperature sensor 93 may be disposed at the inside of the cover 35. In this case, to reduce an effect of heat released from the heat receiving block 32, disposing at a position located away from the heat receiving block 32 is preferable. The temperature sensor 95 may measure a temperature of the heat receiving block 32.

The air blower 18 may be driven by the three-phase alternating-current outputted by the power conversion circuit 11. In the case in which the air blower 18 has a function for adjusting the amount of the air blowing, the air blower controller 29 may output the air blower control signal S3 for adjusting the amount of the air blowing of the air blower 18. In this case, when the rotation speed of the electric motor 91 is equal to or lower than a threshold rotation speed and the measurement value of the temperature of the air outside of the housing 31 that is acquired from the temperature sensor 93 is equal to or lower than the threshold temperature, the controller 19 generates and outputs the air blower control signal S3 providing instruction to reduce the amount of the air blowing, in order to reduce the amount of the air blowing of the air blower 18.

The second threshold rotation speed used for the determination by the air blower controller 29 is not limited to the aforementioned example and may be a value that is the same as the first threshold rotation speed.

Although an example is described above in which the resistance value adjuster 30 generates the circuit control signal S4 for causing an increase in the resistance value of the variable resistor circuit 51 when the measurement value of the rotation speed of the electric motor 91 is equal to or lower than the first threshold rotation speed, the resistance value adjuster 30 may use a threshold rotation speed that is different from the first threshold rotation speed.

The operational status of the load equipment is not limited to the rotation speed of the electric motor 91 and may be any indicator indicating a degree of power consumption in the load equipment. For example, the operational status of the load equipment may be a speed of the railway vehicle in which the power conversion devices 1 and 2 are installed. As other examples, the operational status of the load equipment may be output power of the power conversion circuit 11, an amplitude value of the output voltage, an amplitude value of an output current, and the like.

Circuit configuration of the power conversion circuit 11 is not limited to the aforementioned example. The power conversion circuit 11 may have any circuit configuration as a circuit that includes multiple switching elements 13 and that can convert electric power inputted thereto into electric power to be supplied to the electric motor 91. For example, the power conversion circuit 11 may be a three-level inverter.

The controller 12 may estimate the rotation speed of the electric motor 91 and execute the aforementioned processing based on the estimated rotation speed of the electric motor 91.

The shape of each heat pipe 33 is not limited to the aforementioned example and may be any shape that is attachable to the heat receiving block 32 and in which the refrigerant 33c can be sealed. For example, each heat pipe 33 may be a heat pipe having a U-shape formed by one header 33a and two branch pipes 33b that are attached to both ends of the header 33a so as to be integrated with the header 33a.

The power conversion devices 1 and 2 may be installed in a railway vehicle that employs the alternating-current mode. In this case, alternating-current acquired by the power collector may be stepped down by a transformer, converted into direct-current power by a converter and the direct-current power resulting from the conversion may be supplied to the power conversion devices 1 and 2.

The electric motor 91 is not limited to a three-phase induction motor and may be any electric motor that can execute the aforementioned vector control.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to betaken in a limiting sense, and the scope of the invention is defined only by the included claims, along with the full range of equivalents to which such claims are entitled.

REFERENCE SIGNS LIST 1, 2 Power conversion device
1a, 1b, 51a Input terminal
1c, 1d, 1e, 1f, 1g, 1h, 51b Output terminal
11, 17 Power conversion circuit
12, 16, 19, 20 Controller
13, 52, 53 Switching element
14 IGBT
15 Freewheeling diode
18 Air blower
21 Torque command determination circuit
22 Position estimator
23, 26 Coordinate converter
24 Current command determination circuit
25 Current control circuit
27 Triangular wave generation circuit
28 PWM signal generation circuit
29 Air blower controller
30 Resistance value adjuster
31 Housing
31a Opening
32 Heat receiving block
32a First main surface
32b Second main surface
33 Heat pipe
33a Header
33b Branch pipe
33c Refrigerant
34 Fin
35 Cover
35a Intake/exhaust port
35b Duct
51 Variable resistor circuit
54, 55 Resistor
71 Processing circuit
72 Interface circuit
80 Bus
81 Processor
82 Memory
83 Interface
91 Electric motor
92 Speed sensor
93, 95 Temperature sensor
94 Load equipment
C1, C2 Capacitor
CT1, CT2, CT3 Current sensor
id Excitation current value
iq Torque current value
S1 Operation command
S2 Switching control signal
S3 Air blower control signal
S4 Circuit control signal
Vu U-phase voltage command value
Vv V-phase voltage command value
Vw W-phase voltage command value

The invention claimed is:

1. A power conversion device comprising:
a power conversion circuit including a plurality of switching elements and configured to convert electric power inputted thereto into electric power to be supplied to load equipment and supply to the load equipment the electric power resulting from the conversion;
a housing that houses the power conversion circuit;
at least one heat pipe, with a refrigerant sealed therein, that is thermally connected to the plurality of switching elements included in the power conversion circuit and is exposed to air outside of the housing, the at least one heat pipe being configured to release, to the air, heat transferred from the plurality of switching elements; and
a controlling circuitry to control switching operations of the plurality of switching elements such that (i) a target voltage as a target value of an output voltage is outputted from the power conversion circuit and (ii) an amount of heat generation of the plurality of switching elements is obtained that is based on an operational status of the load equipment and a temperature of the air.

2. The power conversion device according to claim 1, wherein
the power conversion circuit supplies the electric power resulting from the conversion to the load equipment including an electric motor, and
when a rotation speed of the electric motor is equal to or lower than a first threshold rotation speed and the temperature of the air is equal to or lower than a threshold temperature determined based on a temperature at which the refrigerant is freezable, the controlling circuitry controls the switching operations of the plurality of switching elements such that an amount of the heat generation is obtained that is higher than in a case in which (i) the rotation speed of the electric motor is higher than the first threshold rotation speed or (ii) the temperature of the air is higher than the threshold temperature.

3. The power conversion device according to claim 1, wherein the controlling circuitry controls the switching operations of the plurality of switching elements such that an amount of the heat generation of the plurality of switching elements is obtained that is based on the operational status of the load equipment, the temperature of the air, and a temperature of the plurality of switching elements.

4. The power conversion device according to claim 2, wherein the controlling circuitry controls the switching operations of the plurality of switching elements such that an amount of the heat generation of the plurality of switching elements is obtained that is based on the operational status of the load equipment, the temperature of the air, and a temperature of the plurality of switching elements.

5. The power conversion device according to claim 3, wherein
the power conversion circuit supplies the electric power resulting from the conversion to the load equipment including an electric motor, and
when a rotation speed of the electric motor is equal to or lower than a first threshold rotation speed, the temperature of the air is equal to or lower than a threshold temperature determined based on a temperature at which the refrigerant is freezable, and the temperature of the plurality of switching elements is equal to or lower than an upper limit temperature that is within a range of temperatures capable of being withstood by the plurality of switching elements, the controlling circuitry controls the switching operations of the plurality of switching elements such that an amount of the heat generation of the plurality of switching elements is obtained that is higher than in a case in which (i) the rotation speed of the electric motor is higher than the first threshold rotation speed, (ii) the temperature of the air is higher than the threshold temperature or (iii) a temperature of at least one of the plurality of switching elements is higher than the upper limit temperature.

6. The power conversion device according to claim 4, wherein
when the rotation speed of the electric motor is equal to or lower than the first threshold rotation speed, the temperature of the air is equal to or lower than the threshold temperature determined based on the temperature at which the refrigerant is freezable, and the temperature of the plurality of switching elements is equal to or lower than an upper limit temperature that is within a range of temperatures capable of being withstood by the plurality of switching elements, the controlling circuitry controls the switching operations of the plurality of switching elements such that an amount of the heat generation of the plurality of switching elements is obtained that is higher than in a case in which (i) the rotation speed of the electric motor is higher than the first threshold rotation speed, (ii) the temperature of the air is higher than the threshold temperature or (iii) a temperature of at least one of the plurality of switching elements is higher than the upper limit temperature.

7. The power conversion device according to claim 1, wherein the controlling circuitry adjusts a parameter of the switching operations that contributes to increase and decrease in the amount of the heat generation of the plurality of switching elements such that the amount of the heat generation is obtained.

8. The power conversion device according to claim 2, wherein the controlling circuitry adjusts a parameter of the switching operations that contributes to increase and decrease in the amount of the heat generation of the plurality of switching elements such that the amount of the heat generation is obtained.

9. The power conversion device according to claim 7, wherein the controlling circuitry adjusts a switching frequency included in the parameter of the switching operations.

10. The power conversion device according to claim 7, wherein
the power conversion circuit supplies the electric power resulting from the conversion to the load equipment including an electric motor, and
the controlling circuitry adjusts an excitation current command value that is included in the parameter of the switching operations and that is used for determination of the target voltage.

11. The power conversion device according to claim 1, further comprising:
a variable resistor circuit electrically connected to each of the plurality of switching elements included in the power conversion circuit, wherein
the controlling circuitry adjusts a resistance value of the variable resistor circuit such that the amount of the heat generation is obtained.

12. The power conversion device according to claim 2, further comprising:
a variable resistor circuit electrically connected to each of the plurality of switching elements included in the power conversion circuit, wherein
the controlling circuitry adjusts a resistance value of the variable resistor circuit such that the amount of the heat generation is obtained.

13. The power conversion device according to claim 1, further comprising:
an air blower to blow the air outside of the housing to the at least one heat pipe.

14. The power conversion device according to claim 13, wherein
the power conversion circuit supplies the electric power resulting from the conversion to the load equipment including an electric motor, and
when a rotation speed of the electric motor is equal to or lower than a second threshold rotation speed and the temperature of the air is equal to or lower than a threshold temperature determined based on a temperature at which the refrigerant is freezable, the controlling circuitry reduces the amount of the air blowing of the air blower to be lower than in a case in which (i) the rotation speed of the electric motor is higher than the second threshold rotation speed or (ii) the temperature of the air is higher than the threshold temperature.

15. The power conversion device according to claim 13, wherein the controlling circuitry controls the amount of the air blowing of the air blower such that an amount of the air blowing of the air blower is obtained that is based on the operational status of the load equipment, the temperature of the air, and a temperature of the plurality of switching elements.

16. A power conversion device comprising:
a power conversion circuit including a plurality of switching elements and configured to convert electric power inputted thereto into electric power to be supplied to load equipment and supply to the load equipment the electric power resulting from the conversion;
a housing that houses the power conversion circuit;
at least one heat pipe, with a refrigerant sealed therein, that is thermally connected to the plurality of switching elements included in the power conversion circuit and is exposed to air outside of the housing, the at least one heat pipe being configured to release, to the air, heat transferred from the plurality of switching elements;
an air blower to blow the air outside of the housing to the at least one heat pipe; and
a controlling circuitry to control switching operations of the plurality of switching elements and an amount of air blowing of the air blower such that (i) a target voltage as a target value of an output voltage is outputted from the power conversion circuit and (ii) an amount of the air blowing of the air blower is obtained that is based on an operational status of the load equipment and a temperature of the air, wherein
the power conversion circuit supplies the electric power resulting from the conversion to the load equipment including an electric motor, and
when a rotation speed of the electric motor is equal to or lower than a second threshold rotation speed and the temperature of the air is equal to or lower than a threshold temperature determined based on a temperature at which the refrigerant is freezable, the controlling circuitry reduces the amount of the air blowing of the air blower to be lower than in a case in which (i) the rotation speed of the electric motor is higher than the second threshold rotation speed or (ii) the temperature of the air is higher than the threshold temperature.

17. The power conversion device according to claim 16, wherein the controlling circuitry controls the amount of the air blowing of the air blower such that an amount of the air blowing of the air blower is obtained that is based on the operational status of the load equipment, the temperature of the air, and a temperature of the plurality of switching elements.

18. The power conversion device according to claim 17, wherein
when the rotation speed of the electric motor is equal to or lower than the second threshold rotation speed, the temperature of the air is equal to or lower than the threshold temperature determined based on the temperature at which the refrigerant is freezable, and the temperature of the plurality of switching elements is equal to or lower than an upper limit temperature that is within a range of temperatures capable of being withstood by the plurality of switching elements, the controlling circuitry reduces the amount of the air blowing of the air blower to be lower than in a case in which (i) the rotation speed of the electric motor is higher than the second threshold rotation speed, (ii) the temperature of the air is higher than the threshold temperature or (iii) the temperature of the plurality of switching elements is higher than the upper limit temperature.

19. The power conversion device according to claim 16, wherein the controlling circuitry adjusts the amount of the air blowing of the air blower by transmitting a control signal for providing instruction for the air blower to increase or decrease the amount of the air blowing of the air blower.

20. A power conversion device comprising:
a power conversion circuit including a plurality of switching elements and configured to convert electric power inputted thereto into electric power to be supplied to load equipment including an electric motor and supply to the load equipment the electric power resulting from the conversion;
a housing that houses the power conversion circuit;
at least one heat pipe, with a refrigerant sealed therein, that is thermally connected to the plurality of switching elements included in the power conversion circuit and is exposed to air outside of the housing, the at least one heat pipe being configured to release, to the air, heat transferred from the plurality of switching elements;
an air blower to blow the air outside of the housing to the at least one heat pipe; and
a controlling circuitry to control switching operations of the plurality of switching elements and an amount of air blowing of the air blower such that (i) a target voltage as a target value of an output voltage is outputted from the power conversion circuit and (ii) an amount of the air blowing of the air blower is obtained that is based on an operational status of the load equipment, a temperature of the air, and a temperature of the plurality of switching elements, wherein
when a rotation speed of the electric motor is equal to or lower than a second threshold rotation speed, the temperature of the air is equal to or lower than a threshold temperature determined based on a temperature at which the refrigerant is freezable, and the temperature of the plurality of switching elements is equal to or lower than an upper limit temperature that is within a range of temperatures capable of being withstood by the plurality of switching elements, the control circuitry reduces the amount of the air blowing of the air blower to be lower than in a case in which (i) the rotation speed of the electric motor is higher than the second threshold rotation speed, (ii) the temperature of the air is higher than the threshold temperature or (iii) the temperature of the plurality of switching elements is higher than the upper limit temperature.

* * * * *